(12) United States Patent
Kojima

(10) Patent No.: US 11,967,949 B2
(45) Date of Patent: Apr. 23, 2024

(54) BIAS CIRCUIT, SENSOR DEVICE, AND WIRELESS SENSOR DEVICE

(71) Applicant: Mitsubishi Electric Corporation, Tokyo (JP)

(72) Inventor: Tomokazu Kojima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 42 days.

(21) Appl. No.: 17/792,918

(22) PCT Filed: Mar. 24, 2020

(86) PCT No.: PCT/JP2020/013038
§ 371 (c)(1),
(2) Date: Jul. 14, 2022

(87) PCT Pub. No.: WO2021/192040
PCT Pub. Date: Sep. 30, 2021

(65) Prior Publication Data
US 2023/0068062 A1   Mar. 2, 2023

(51) Int. Cl.
*G01R 1/30* (2006.01)
*G01R 19/00* (2006.01)
*H03K 17/687* (2006.01)

(52) U.S. Cl.
CPC ..... *H03K 17/6872* (2013.01); *G01R 19/0084* (2013.01); *H03K 2217/0036* (2013.01); *H03K 2217/0081* (2013.01)

(58) Field of Classification Search
CPC ............... G01R 19/0084; G05F 3/242; H03K 17/6872; H03K 2217/0036
See application file for complete search history.

(56) References Cited

U.S. PATENT DOCUMENTS 8,400,219 B2 *   3/2013  Clark ................. H03F 3/45179
                                                      330/288
10,033,364 B1 *  7/2018  Coban ................ H03K 5/1532
(Continued)

FOREIGN PATENT DOCUMENTS

| JP | 2008520028 A | 6/2008 |
| JP | 2011186987 A | 9/2011 |
| WO | 2006051486 A2 | 5/2006 |

OTHER PUBLICATIONS

International Search Report (PCT/ISA/210) with translation and Written Opinion (PCT/ISA/237) dated Jul. 7, 2020, by the Japan Patent Office as the International Searching Authority for International Application No. PCT/JP2020/013038. (9 pages).

(Continued)

*Primary Examiner* — Thang X Le
(74) *Attorney, Agent, or Firm* — BUCHANAN INGERSOLL & ROONEY PC

(57) ABSTRACT

A current mirror circuit and a current generation circuit are connected in series between a power supply node and a ground node through a first node and a second node. Gates of transistors constituting the current mirror circuit are connected to the node that supplies an off-voltage of the transistors through a first switch, and is connected to the second node through a second switch. The second node is connected to the node that supplies an on-voltage of the transistors through a third switch. Before starting of the circuit, the first switch and the third switch are turned on while the second switch is turned off. After starting of the circuit, on and off of the first to third switches are switched.

17 Claims, 14 Drawing Sheets

(56) References Cited

U.S. PATENT DOCUMENTS

2009/0009152 A1\* 1/2009 Chen .................. G05F 3/205
                                                    323/315
2011/0063002 A1\* 3/2011 Liu .................... G05F 3/242
                                                    327/537
2011/0221517 A1    9/2011 Yuasa

OTHER PUBLICATIONS

Gray et al., "Analysis and Design of Analog Integrated Circuits Fourth Edition", John Wiley & Sons, Inc., 2001, p. 298-313.

\* cited by examiner

BIAS CIRCUIT, SENSOR DEVICE, AND WIRELESS SENSOR DEVICE

TECHNICAL FIELD

The present disclosure relates to a bias circuit, and a sensor device and a wireless sensor device that include the bias circuit.

BACKGROUND ART

In recent years, with the progress of Internet of Things (IoT) technology and the like, there is an increasing need for technologies of high-precision sensors and sensor interfaces. Specifically, a system technology for connecting a person and an object using information detected with a sensor is required by accurately receiving information from a sensor device with an operational amplifier (or a comparator) at an input stage to perform analog signal processing or digital signal processing. At this time, a highly-accurate bias circuit is required to perform highly-accurate analog signal processing.

A circuit called a self-bias circuit that generates a bias voltage that does not directly depend on a power supply voltage is known in order to implement the highly-accurate bias circuit. A bandgap reference circuit generating a constant reference voltage and current for temperature variation and process variation in addition to power supply voltage variation is also known as a part of the self-bias circuit.

Japanese Patent Laying-Open No. 2011-186987 (PTL 1) describes a reference current generation circuit that does not require a PN junction diode and has substantial zero temperature dependency as an example of such a self-bias circuit.

In the self-bias circuit, it is known that there are two stable operating points. One is a stable operating point that generates good bias and the other is a zero-bias operating point where the circuit does not operate at all.

In the reference current generation circuit of PTL 1, a starting circuit including a constant current source is disposed in order to start at a stable operating point beyond the zero bias point.

CITATION LIST

Patent Literature

PTL 1: Japanese Patent Laying-Open No. 2011-186987

SUMMARY OF INVENTION

Technical Problem

However, in the circuit configuration of PTL 1, when the current by the constant current source of the starting circuit is cut off after the circuit starting, the reference current (bias current) cannot be generated at the time of restarting. As a result, a leakage current is continuously generated in the starting circuit throughout a generation period of the bias current, and power consumption increases. Furthermore, existence of such the leakage current is added to the bias current generated by the bias circuit, which may cause an error of the bias current.

The present disclosure has been made to solve such the problem, and an object of the present disclosure is to provide a configuration of a bias circuit that achieves both stable starting performance and low power consumption after the starting and high accuracy of bias.

Solution to Problem

According to one aspect of the present disclosure, a bias circuit includes a current mirror circuit including first conductivity type first and second transistors, a current generation circuit including a second conductivity type transistor, a starting control circuit, and a starting circuit. The first conductivity type first and second transistors are connected between a first power supply node that supplies a first voltage and the first and second nodes. The current generation circuit is connected between the second power supply node that supplies a second voltage and the first and second nodes. During starting of the bias circuit, the starting control circuit detects transition from a first state continuing from before the starting to a second state accompanied by the starting. The control electrodes of the first and second transistors connected to each other are electrically connected to one node that is one of the first and second nodes in at least the second state. The starting circuit switches a connection destination of the control electrodes between the first state and the second state when the bias circuit is started. The starting circuit includes first to third switches. The first switch is connected between a first voltage node that supplies an off-voltage to turn off the first and second transistors and the control electrodes. The second switch is connected between the third node and the control electrodes. The third switch is connected between a second voltage node that supplies an on-voltage to turn on the first and second transistors and the third node. The first switch and the second switch are turned off in the first state and turned on in the second state. The third switch is turned on in the first state and turned off in the second state.

According to another aspect of the present disclosure, a sensor device includes the bias circuit, a sensor, and an amplifier circuit. The sensor outputs a detection voltage corresponding to a physical quantity of a measurement target. The bias circuit outputs at least a bias current. The amplifier circuit generates an output voltage based on the detection voltage from the sensor by an amplification operation using the bias current from the bias circuit.

According to still another aspect of the present disclosure, a wireless sensor device includes the bias circuit, a sensor, an amplifier circuit, and a wireless communication unit. The sensor outputs a detection voltage corresponding to a physical quantity of a measurement target. The bias circuit outputs at least a bias current. The amplifier circuit generates an output voltage based on the detection voltage from the sensor by an amplification operation using the bias current from the bias circuit. The wireless communication unit outputs a transmission signal according to a predetermined communication protocol by wireless communication. The transmission signal is generated based on digital data obtained by analog-digital conversion of the output voltage of the amplifier circuit.

Advantageous Effects of Invention

According to the present disclosure, when the starting circuit forcibly supplies the off-voltage and the on-voltage to the control electrode of the transistor constituting the current mirror circuit, the current is certainly generated in the current mirror circuit and the current generation circuit at the time of circuit starting, and an unnecessary current is not generated in the starting circuit after the starting. As a result, both the stable starting performance and the low power consumption after the starting and the high accuracy of the bias can be achieved.

DESCRIPTION OF EMBODIMENTS

Figure 1:
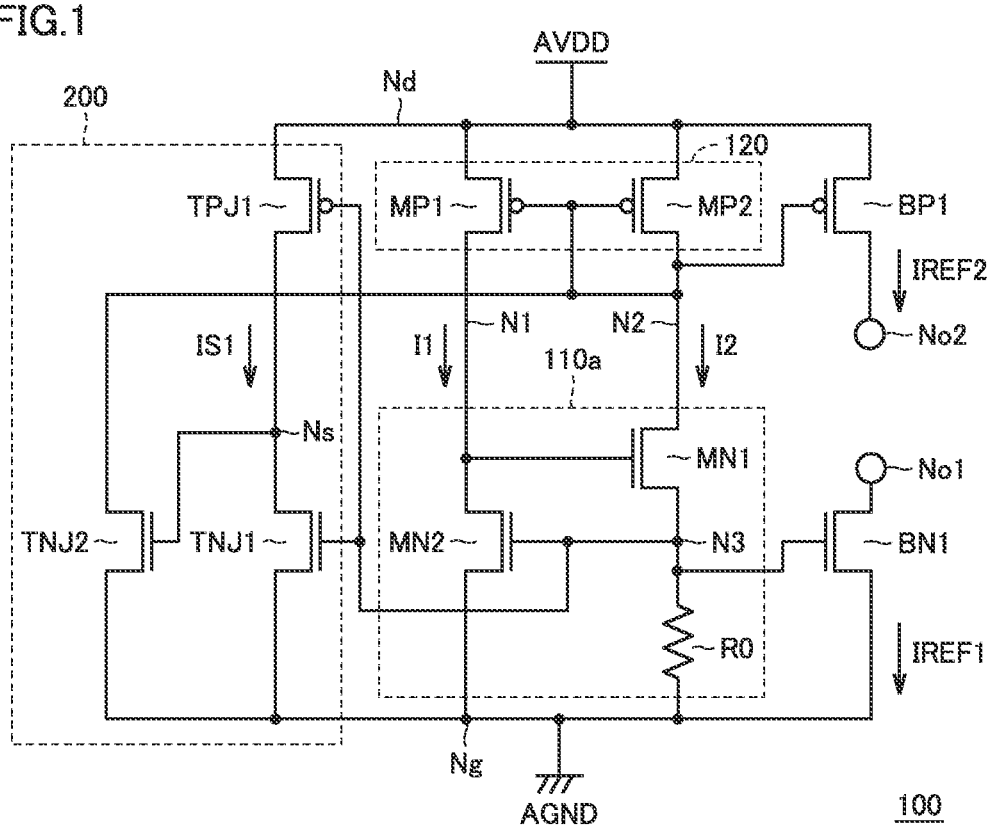
FIG. 1 is a circuit diagram illustrating a configuration of a bias circuit according to a comparative example.

With reference to the drawings, embodiments of the present disclosure will be described in detail below. In the drawings, the same or corresponding portion is denoted by the same reference numeral, and the description will not be repeated in principle.

First Embodiment

Description of Comparative Example

FIG. 1 is a circuit diagram illustrating a configuration of a bias circuit according to a comparative example.

With reference to FIG. 1, a bias circuit 100 of the comparative example includes a current generation circuit 110a, a current mirror circuit 120, and a starting circuit 200.

Current generation circuit 110a and current mirror circuit 120 are connected in series between a power supply node Nd that supplies a power supply voltage AVDD and a ground node Ng that supplies a ground voltage AGND through nodes N1 and N2.

Current mirror circuit 120 includes P-type field effect transistors (hereinafter, also simply referred to as "P-type metal oxide semiconductor (PMOS) transistors") MP1, MP2. PMOS transistor MP1 is connected between power supply node Nd and node N1, and PMOS transistor MP2 is connected between power supply node Nd and node N2. Gates of PMOS transistors MP1, MP2, which are "control electrodes", are commonly connected to node N2.

Current generation circuit 110a includes N-type field effect transistors (hereinafter, also simply referred to as an "NMOS transistor") MN1, MN2 and a resistance element R0. NMOS transistor MN2 is connected between node N1 and ground node Ng. NMOS transistor MN1 is connected between nodes N2 and N3, and resistance element R0 is connected between node N3 and ground node Ng. The gate (control electrode) of NMOS transistor MN1 is connected to node N1, and the gate (control electrode) of NMOS transistor MN2 is connected to node N3.

Figure 2:
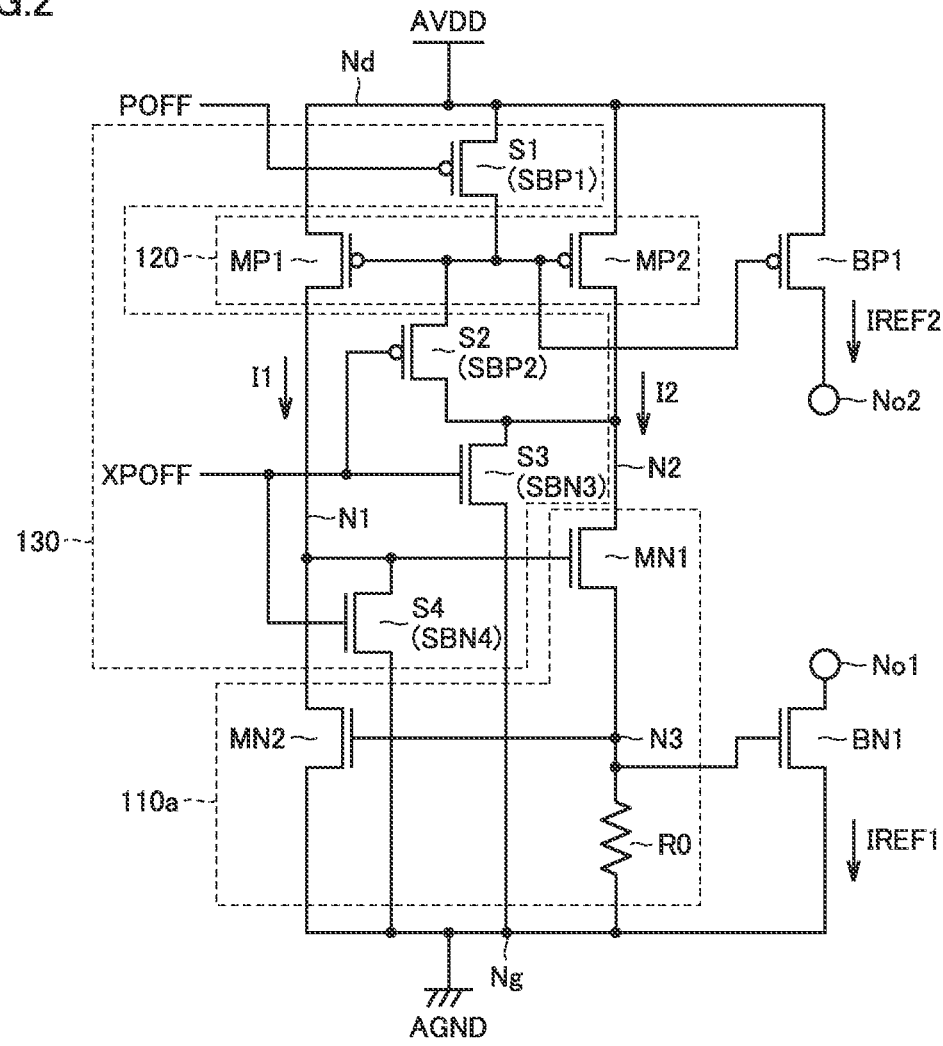
FIG. 2 is a circuit diagram illustrating a configuration of a bias circuit according to a first embodiment.

The circuit configuration including current generation circuit 110a and current mirror circuit 120 is equivalent to the circuit configuration in which the starting circuit is excluded from a reference current generation circuit (X2) in FIG. 2 of PTL 1.

Bias circuit 100 further includes an output transistor BP1 and an output transistor BN1 that output a bias current. Output transistor BN1 includes an NMOS transistor connected between a bias output node No1 and ground node Ng. The gate of output transistor BN1 is connected to node N3. A load (for example, a resistor or a PMOS transistor) is connected between bias output node No1 and power supply node Nd, so that a reference current IREF1 proportional to a current I2 of node N2 is output from output transistor BN1 through bias output node No1.

Output transistor BP1 includes a PMOS transistor connected between power supply node Nd and a bias output node No2. The gate of output transistor BP1 is connected to node N2. A load (for example, a resistor or an NMOS transistor) is connected between bias output node No2 and ground node Ng, a reference current IREF2 proportional to current I2 of node N2 is output from output transistor BP1 through bias output node No2. In this manner, bias circuit 100 can generate reference currents IREF1, IREF2 proportional to current I2 flowing through nodes N2 and N3 as bias currents.

First, the operation of bias circuit 100 in a configuration in which the starting circuit 200 is excluded will be described.

During the stable operation of bias circuit 100, a voltage higher than a threshold voltage Vt of NMOS transistor MN2 is generated at node N3, so that NMOS transistor MN2 generates a drain current. Similarly, when the voltage at node N1 rises above ground voltage AGND and when the voltage at node N2 falls below power supply voltage AVDD, drain currents are also generated in NMOS transistor MN1 and PMOS transistors MP1, MP2.

At this point, when the electric resistance value of resistance element R0 is also expressed as R0, current I2 of node N2 is expressed by the following equation (1) of the voltage using threshold Vt.

$$I2 = Vt/R0 \qquad (1)$$

As understood from the equation (1), current I2 does not depend on power supply voltage AVDD. Furthermore, resistance element R0 is selected such that a polarity of the temperature dependence of electric resistance value R0 is opposite to a polarity of the temperature dependence of threshold voltage Vt, so that the temperature dependence of current I2 can be reduced.

Reference currents IREF1, IREF2 are proportional to current I2, namely, (Vt/R0). Accordingly, bias circuit 100 can operate as the self-bias circuit that does not depend on power supply voltage AVDD, but has small temperature dependency, and generates the bias current with high accuracy.

However, in the zero bias state of bias circuit 100, no voltage is generated at node N3 (ground voltage AGND is maintained), and the drain current of NMOS transistor MN2 becomes substantially zero because the gate voltage is 0 (V). Because of this, the voltage at node N1 connected to the gate of NMOS transistor MN1 also does not increase, and the drain current of NMOS transistor MN1 also becomes substantially zero.

As described above, when the drain current is not generated in NMOS transistors MN1, MN2, the voltage at node N2 connected to the gates of PMOS transistors MP1, MP2 cannot be changed onto the side of ground voltage AGND, so that the drain currents of PMOS transistors MP1, MP2 are not generated. As a result, in bias circuit 100, the currents at nodes N1, N2 become I1=I2=0, and bias circuit 100 cannot naturally come out of this state (also referred to as "zero bias state"). When I1=I2=0, IREF1=IREF2=0 is obtained, so that bias circuit 100 cannot generate the bias current.

Accordingly, in bias circuit 100 of the comparative example, starting circuit 200 is disposed in order to get out the zero bias state. Starting circuit 200 includes a PMOS transistor TPJ1 and NMOS transistors TNJ1, TNJ2.

PMOS transistor TPJ1 and NMOS transistor TNJ1 are connected in series between power supply node Nd and ground node Ng through a node Ns. The gates of PMOS transistor TPJ1 and NMOS transistor TNJ1 are connected to node N3. NMOS transistor TNJ2 is connected between node N2 and ground node Ng. The gate of NMOS transistor TNJ2 is connected to node Ns.

PMOS transistor TPJ1 and NMOS transistor TNJ1 operate as a complementary MOS (CMOS) inverter having node N3 as an input node and node Ns as an output node. NMOS transistor TNJ2 is driven according to the output voltage of CMOS inverter.

The above-described zero bias state is generated because the voltage at node N3 does not rise from ground voltage AGND. On the other hand, in starting circuit 200, when the voltage at node N3 is ground voltage AGND, PMOS transistor TPJ1 is fully turned on, so that the voltage at node Ns increases to power supply voltage AVDD. In response to this, NMOS transistor TNJ2 is fully turned on, so that the voltage at node N2 decreases to ground voltage AGND. Because of this, the gate voltages of PMOS transistors MP1, MP2 decrease to ground voltage AGND, the drain current is generated in diode-connected PMOS transistor MP2, and the drain current is also generated in PMOS transistor MP1 by the action of the current mirror.

The drain current of PMOS transistor MP1 increases the voltage at node N1, so that the gate voltage of NMOS transistor MN1 increases. Eventually, when NMOS transistor MN1 is turned on because the gate voltage becomes sufficiently high, the voltage at node N3 increases. The voltage V(N3) at node N3 rises to the voltage higher than threshold voltage Vt of NMOS transistor MN2, and then converges to the state (I2=Vt/R0) of the above equation (1), namely, V(N3)=Vt.

The voltage at node N3 can be gotten out of ground voltage AGND by disposing starting circuit 200 in this manner, so that the zero bias state can be certainly escaped from to operate bias circuit 100 at a stable operating point according to the equation (1).

However, in starting circuit 200, the gate voltage of NMOS transistor TNJ1 is common to the gate voltage of NMOS transistor MN2 that causes current I1 to flow.

In addition, because the gate voltage of PMOS transistor TPJ1 also corresponds to threshold voltage Vt of NMOS transistor MN2, the drain current of PMOS transistor TPJ1 is generated. As a result, in starting circuit 200, in parallel with the supply of reference currents IREF1, IREF2 due to the generation of currents I1, I2, current IS1 at the same level as current I1 is generated between power supply node Nd and ground node Ng through PMOS transistor TPJ1 and NMOS transistor TNJ1.

Because current IS1 is the leakage current that is originally unnecessary for bias circuit 100, there is a concern that the power consumption of bias circuit 100 increases. Furthermore, when the leakage current is added to currents I1, I2 due to wraparound, reference currents IREF1 IREF2 do not match a design value based on current I2 in the equation (1), and there is a concern that the accuracy of the bias current decreases. That is, in the reference current generation circuit of PTL 1 and the comparative example of FIG. 1, there is a concern about a similar problem caused by the starting circuit.

Circuit Configuration of First Embodiment

In the first embodiment, a configuration of the bias circuit reducing the power consumption and increasing bias accuracy, which is characteristic of a configuration of the starting circuit, will be described.

FIG. 2 is a circuit diagram illustrating a configuration of the bias circuit according to a first embodiment.

With reference to FIG. 2, bias circuit 101 of the first embodiment includes current generation circuit 110a and current mirror circuit 120 similar to those of bias circuit 100 of the comparative example, a starting circuit 130, and a starting control circuit 150.

Each of current generation circuit 110a and current mirror circuit 120 is configured similarly to bias circuit 100 of the comparative example, and is connected in series between power supply node Nd and ground node Ng through nodes N1 and N2. Starting control circuit 150 generates starting control signals POFF and XPOFF based on the level of power supply voltage AVDD.

Figure 3:
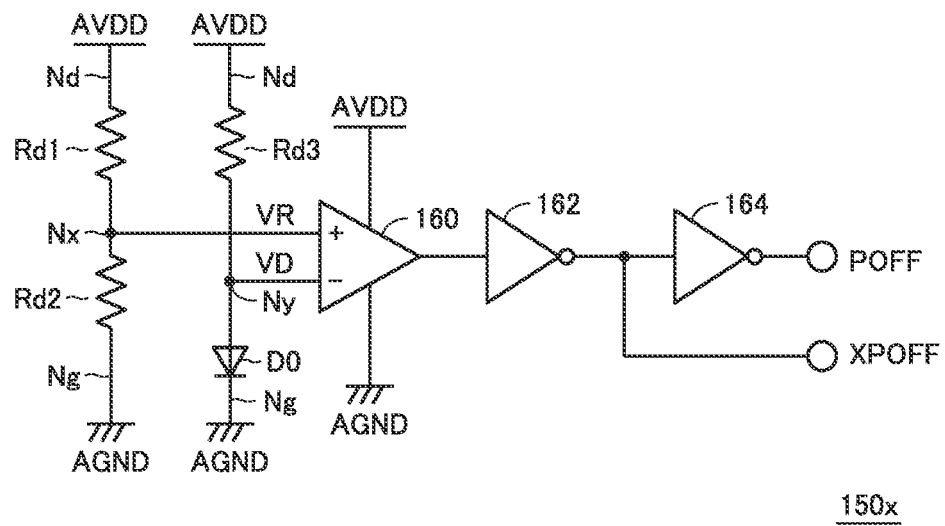
FIG. 3 is a circuit diagram illustrating a first configuration example of a starting control circuit in FIG. 2.

FIG. 3 is a circuit diagram illustrating a first configuration example of starting control circuit 150.

With reference to FIG. 3, a starting control circuit 150x of the first configuration example includes resistance elements Rd1 to Rd3, a diode D0, a comparator 160, and inverters 162, 164. Hereinafter, the electric resistance values of resistance elements Rd1 to Rd3 are also referred to as Rd1 to Rd3.

Resistance elements Rd1 and Rd2 are directly connected between power supply node Nd and ground node Ng through a node Nx to constitute a voltage dividing circuit. Resistance element Rd3 is connected between the power supply node and a node Ny. Diode D0 is connected between node Ny and ground node Ng with the direction from node Ny to ground node Ng as a forward direction.

Comparator 160 outputs a comparison result between a voltage VNx at node Nx and a voltage VNy at node Ny. Specifically, comparator 160 outputs a logic high level (hereinafter, simply referred to as an "H level") signal when VNx>VNy, and comparator 160 outputs a logic low level signal (hereinafter, simply referred to as an "L level") signal when VNy>VNx.

Inverter 162 inverts a logic level of an output signal of comparator 160, and outputs a starting control signal XPOFF. Inverter 164 inverts the logic level of the output signal (starting control signal XPOFF) of inverter 162, and outputs a starting control signal POFF. Accordingly, POFF=L and XPOFF=H when VNx<when VNy, and POFF=H and XPOFF=L when VNx>VNy.

In node Nx, voltage VNx represented by the following equation (2) is generated according to a voltage division ratio by resistance elements Rd1, Rd2.

$$VNx = AVDD \cdot Rd2/(Rd1+Rd2) \qquad (2)$$

On the other hand, when power supply voltage AVDD can forward bias diode D0, voltage VNy corresponding to forward voltage Vf at diode D0 is generated at node Ny without depending on the voltage value of power supply voltage AVDD (VNy=Vf).

Figure 4:
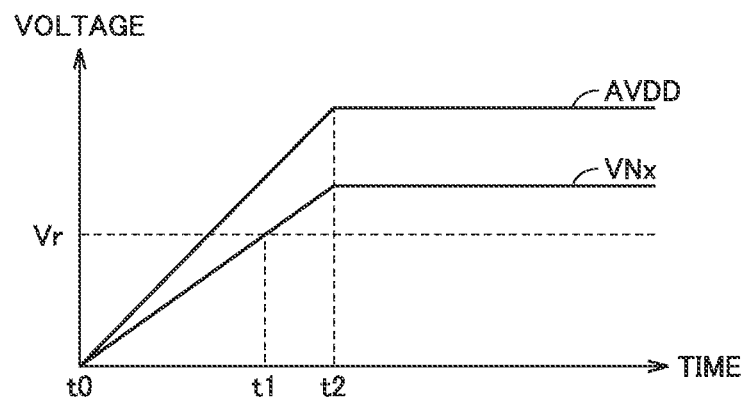
FIG. 4 is a waveform diagram illustrating an operation of the starting control circuit.

FIG. 4 is a waveform diagram illustrating an operation of starting control circuit 150x.

With reference to FIG. 4, at the time of the starting of bias circuit 101, power supply voltage AVDD increases according to power-on at time t0. Power supply voltage AVDD is in a steady state after time t2.

Voltage VNx increases in proportion to power supply voltage AVDD as illustrated in the equation (2). On the other hand, because of voltage VNy=Vf, voltage VNy is constant. Accordingly, comparator 160 equivalently operates to output a comparison result between voltage VNx and a determination voltage Vr represented by the following equation (3).

$$Vr = Vf \cdot (Rd1+Rd2)/Rd2 \qquad (3)$$

Accordingly, because comparator 160 outputs the L level at times t0 to t1 (power-off state) when power supply voltage AVDD is lower than or equal to determination voltage Vr, starting control signal POFF is set to the L level, and starting control signal XPOFF is set to the H level. Determination voltage Vr can be previously adjusted so as to have a margin relative to the minimum operating voltage at which bias circuit 101 can operate.

On the other hand, because comparator 160 outputs the H level after time t1 (power-on state) when power supply voltage AVDD is higher than determination voltage Vr, starting control signal POFF is set to the H level, and starting control signal XPOFF is set to the L level. In this manner, starting control circuit 150x can generate starting control signals POFF, XPOFF so as to distinguish the power-off state and the power-on state according to power supply voltage AVDD.

The power-off state corresponds to a "first state" continuing from before the starting of bias circuit 101, and the power-on state corresponds to a "second state" transitioning from the "first state" in association with the starting.

Figure 5:
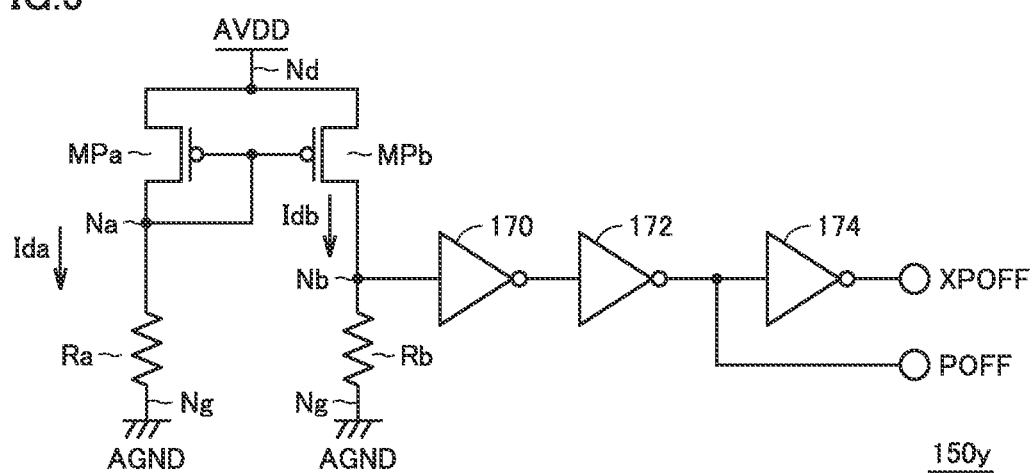
FIG. 5 is a circuit diagram illustrating a second configuration example of the starting control circuit in FIG. 2.

FIG. 5 illustrates a second configuration example of starting control circuit 150 in FIG. 3.

With reference to FIG. 5, a starting control circuit 150y of the second configuration example includes resistance elements Ra, Rb, PMOS transistors MPa, MPb, and inverters 170, 172, 174. Hereinafter, the electric resistance values of resistance elements Ra, Rb are also referred to as Ra, Rb.

PMOS transistor MPa is connected between power supply node Nd and node Na, and PMOS transistor MPb is connected between power supply node Nd and node Nb. Resistance element Ra is connected between node Na and ground node Ng, and resistance element Rb is connected between node Nb and ground node Ng.

Inverter 170 outputs the L-level signal when the voltage at node Nb is lower than the threshold voltage of inverter 170, and outputs the H-level signal when the voltage at node Nb is higher than the threshold voltage.

Inverter 172 inverts the logic level of the output signal of inverter 170, and outputs starting control signal POFF. Inverter 174 inverts the logic level of the output signal (starting control signal POFF) of inverter 172, and outputs starting control signal XPOFF.

The gate of PMOS transistor MPa is connected to node Na, and also connected to the gate of PMOS transistor MPb. That is, PMOS transistor MPa is diode-connected, and when power supply voltage AVDD becomes higher than the absolute value of threshold voltage Vtp of PMOS transistor MPa (AVDD>|Vtp|), a drain current Ida is generated in PMOS transistor MPa. Drain current Ida in the saturation region can be represented by the following equation (4). ΔV in the equation (4) is an overdrive voltage due to the drain current, and ΔV<0 in the PMOS transistor. When AVDD>|Vtp+ΔV|, PMOS transistor MPa operates in the saturation region. Usually, |ΔV| is about 0.2 to about 0.4 (V).

$$Ida = (AVDD - |Vtp| + \Delta V)/Ra \qquad (4)$$

On the other hand, because PMOS transistor MPb constitutes a current mirror with PMOS transistor MPa, a current Idb similar to the equation (4) flows through node Nb and resistance element Rb.

Because of Ida=Idb=0 in the state (power-off state) of AVDD<|Vtp| before the circuit starting, voltage VNb at node Nb is equal to ground voltage AGND. At this point, the output signal of inverter 170 is at the H level. Thus, in the power-off state, POFF=L and XPOFF=H are satisfied.

On the other hand, when the state of AVDD>|Vtp| is reached after the circuit starting, voltage VNb at node Nb increases due to the voltage drop amounts Idb Rb caused by current Idb. Thus, the output signal of inverter 170 changes from the H level to the L level as power supply voltage AVDD rises. Thus, in the power-on state after the increase in power supply voltage AVDD, POFF=H and XPOFF=L are obtained. In addition, in starting control circuit 150y, determination voltage Vr in FIG. 4 can be adjusted by electric resistance values Ra, Rb.

Accordingly, also in starting control circuit 150y in FIG. 5, similarly to starting control circuit 150x (FIG. 3), starting control signals POFF, XPOFF can be generated to distinguish the power-off state and the power-on state according to the increase in power supply voltage AVDD.

Starting control circuit 150x in FIG. 3 needs to increase power supply voltage AVDD to some extent (for example, AVDD≥about 1.8 (V)) in order to operate comparator 160. On the other hand, starting control circuit 150y in FIG. 5 can be configured with a diode-connected transistor and a resistance element, so that the starting control circuit can operate even at a relatively low power supply voltage (for example, AVDD=about 1.2 (V)). However, because comparator 160 (operational amplifier) is used, the voltage detection accuracy of starting control circuit 150x is higher than that of starting control circuit 150y.

With reference to FIG. 2 again, in bias circuit 101 of the first embodiment, starting circuit 130 includes at least switches S1 to S3 that are controlled to be turned on and off by starting control signals POFF, XPOFF. First, a circuit operation in the state where only switches S1 to S3 are disposed will be described.

Switch S1 is connected between the gates of PMOS transistors MP1, MP2 constituting current mirror circuit 120 and the node that supplies a gate voltage (hereinafter, "off-voltage") at which PMOS transistors MP1, MP2 are turned off. Because off-voltage of PMOS transistors MP1, MP2 can be power supply voltage AVDD, in FIG. 2, switch S1 is configured with a PMOS transistor SBP1 connected between power supply node Nd and the gates of PMOS transistors MP1, MP2.

Consequently, in the first embodiment, power supply node Nd corresponds to an example of the "first voltage node" that supplies the off-voltage of current mirror circuit 120, and ground node Ng corresponds to an example of the "second voltage node" that supplies the on-voltage of current mirror circuit 120.

Switch S1 is turned on in the power-off state, and is turned off in the power-on state. For this reason, starting control signal POFF set to the L level in the power-off state and set to the H level in the power-on state is input to the gate of PMOS transistor SBP1.

Switch S2 is connected between the gates of PMOS transistors MP1, MP2 and node N2. Switch S3 is connected between node N2 and a node that supplies the gate voltage (hereinafter, referred to as an "on-voltage") at which PMOS transistors MP1, MP2 are turned on. Because on-voltages of PMOS transistors MP1, MP2 can be ground voltage AGND, in FIG. 2, switch S3 is configured with NMOS transistor SBN3 connected between ground node Ng and node N2.

Switch S3 is turned on in the power-off state, and is turned off in the power-on state. For this reason, starting control signal XPOFF set to the H level in the power-off state and set to the L level in the power-on state is input to the gate of NMOS transistor SBN3.

Because switch S2 is turned off in the power-off state and turned on in the power-on state, switch S2 and switch S3 are complementarily turned on and off. For this reason, switch S2 can be configured with PMOS transistor SBP2 in which starting control signal XPOFF common to NMOS transistor SBN3 is input to the gate.

In the power-off state (POFF=L, XPOFF=H) before the power is turned on, switch S1 is turned on and switch S2 is turned off, whereby PMOS transistors MP1, MP2 are certainly turned off in starting circuit 130. On the other hand, ground voltage AGND (on-voltage) is supplied to node N2 disconnected from PMOS transistors MP1, MP2 by turning off switch S2, when switch S3 is turned on, and the on-voltage is held by parasitic capacitance.

In the power-on state (POFF=H, XPOFF=L) in which power supply voltage AVDD increases after the power-on, switches S1, S3 are turned off and switch S2 is turned on in starting circuit 130. The gates of PMOS transistors MP1, MP2 are disconnected from power supply voltage AVDD (off-voltage) by turning off switch S1, and connected to node N2 by turning on switch S2, whereby the on-voltage (ground voltage AGND) is supplied to the gates of PMOS transistors MP1, MP2. This makes it possible to certainly generate the drain current in PMOS transistors MP1, MP2 constituting current mirror circuit 120 during the transition from the power-off state to the power-on state.

In the power-on state, node N2 is disconnected from ground node Ng by turning off switch S3, and node N2 is connected to the gates of PMOS transistors MP1, MP2 by turning on switch S2. That is, switch S2 to be turned on can form a path connecting node N2 and the gates of PMOS transistors MP1, MP2 (current mirror circuit 120) similar to bias circuit 100 in FIG. 1.

As a result, in the power-on state, current mirror circuit 120 and current generation circuit 110a have a circuit configuration equivalent to a circuit configuration in which starting circuit 200 is removed from bias circuit 100 in FIG. 1. Thus, as described with reference to FIG. 1, the bias current can be supplied through output transistors BP1, BN1 using currents I1, I2.

As described above, in bias circuit 101 of the first embodiment, during the transition from the power-off state to the power-on state, the gate voltages of PMOS transistors MP1, MP2 constituting current mirror circuit 120 are forcibly controlled so as to generate the drain current, whereby currents I1, I2 can be certainly generated. Furthermore, in the power-on state, an unnecessary current not directly related to currents I1, I2 such as current IS1 in the bias circuit of the comparative example in FIG. 1 does not flow through starting circuit 130. As a result, both the stable starting characteristic and the low power consumption and high bias accuracy after starting can be achieved.

Further, starting circuit 130 can include a switch S4.

Switch S4 is connected between the gate of NMOS transistor MN1 of current generation circuit 110a and the node that supplies the off-voltage of NMOS transistor. That is, switch S4 includes NMOS transistor SBN4 connected between node N1 and ground node Ng.

Switch S4 is turned on in the power-off state, and is turned off in the power-on state. For this reason, starting control signal XPOFF set to the H level in the power-off state and set to the L level in the power-on state is input to the gate of NMOS transistor SBN4.

When switch S4 is provided, in the power-off state, the path of current I2 is cut off by both PMOS transistor MP2 and NMOS transistor MN1. Thus, the effect of suppressing the leakage current of bias circuit 101 in the power-off state is enhanced. Accordingly, standby power can be prevented in the power-off state of bias circuit 101. In the power-on state, because NMOS transistor MN1 (and node N1) is disconnected from ground node Ng by turning off switch S4, it is understood that switch S4 does not affect the operation of bias circuit 101.

Although FIG. 2 illustrates the configuration example in which switches S2 and S3 are connected in series between the gates of PMOS transistors MP1, MP2 and ground node Ng (on-voltage) through node N2, switches S2 and S3 may be connected in series through separately-independent nodes instead of node N2. In this case, the gates of PMOS transistors MP1, MP2 and node N2 are connected in the same manner as in FIG. 1, and in the power-off state, the on-voltage of the PMOS transistor is held in the independent node. Conversely, in the configuration example of FIG. 2, a circuit area can be prevented by effectively utilizing node N2 as the holding node of the on-voltage.

In the first embodiment, power supply node Nd connected to current mirror circuit 120 corresponds to an example of the "first power supply node", and power supply voltage AVDD corresponds to the "first voltage". On the other hand, ground node Ng connected to current generation circuit 110a corresponds to an example of the "second power supply node", and ground voltage AGND corresponds to the "second voltage". The P-type corresponds to an example of the "first conductivity type", and the N-type corresponds to an example of the "second conductivity type".

Further, switches S1 to S4 of starting circuit 130 correspond to the "first switches" to the "fourth switches", respectively, and PMOS transistors MP1, MP2 constituting current mirror circuit 120 correspond to examples of the "first transistors" and the "second transistors", respectively. In current generation circuit 110a, NMOS transistor MN1 corresponds to an example of the "third transistor". In addition, nodes N1 and N2 correspond to an example of the "first node" and the "second node", and in particular, node N2 connected to the gates of PMOS transistors MP1, MP2 corresponds to the "one node". As described above, FIG. 2 illustrates a configuration in which the "third node" holding the on-voltage is shared with node N2 (the one node).

Modifications of First Embodiment

Figure 6:
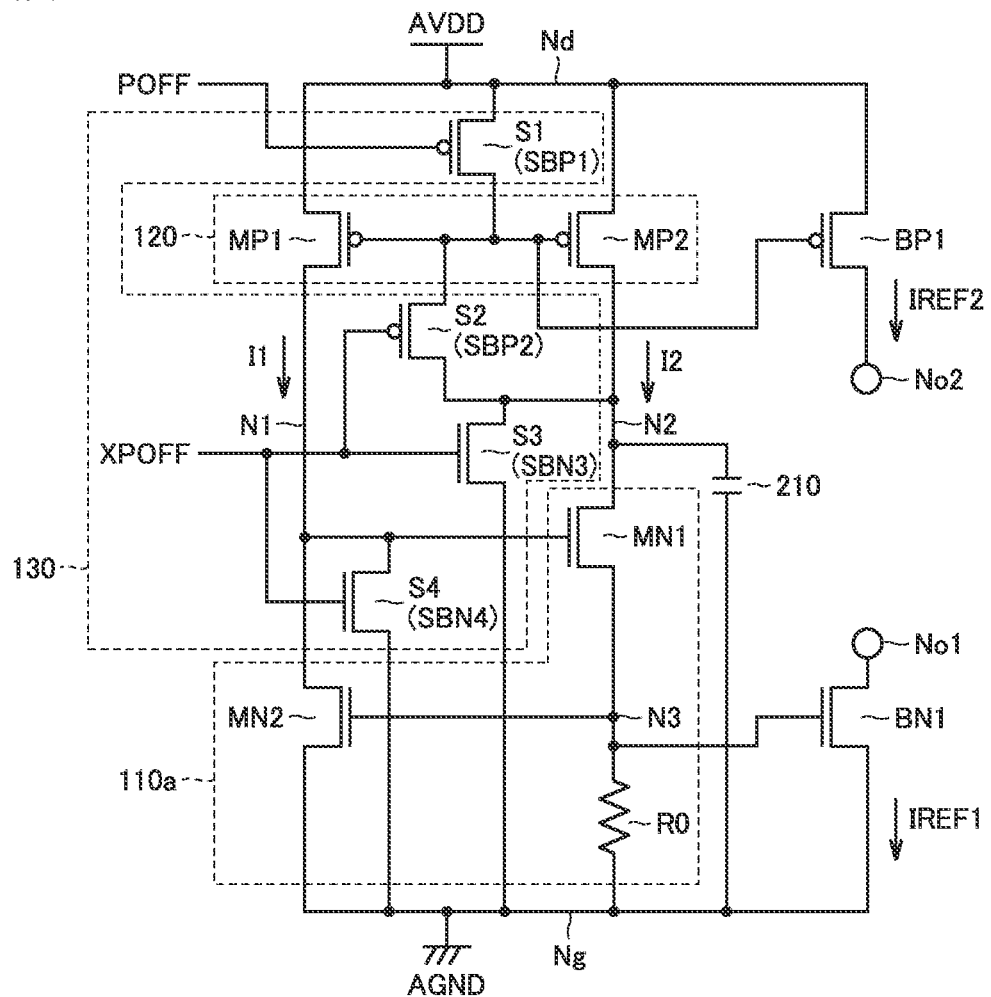
FIG. 6 is a circuit diagram illustrating a configuration of a bias circuit according to a first modification of the first embodiment.
Figure 6:
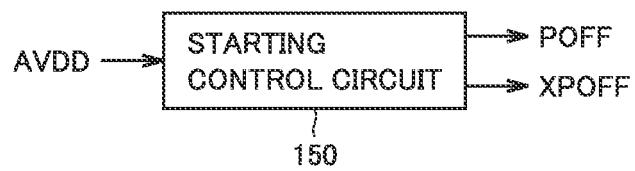

FIG. 6 is a circuit diagram illustrating a configuration of a bias circuit 102 according to a first modification of the first embodiment.

With reference to FIG. 6, bias circuit 102 of the first modification of the first embodiment is different from bias circuit 101 of the first embodiment in further including a capacitor 210. Because other configurations of bias circuit 102 are similar to those of bias circuit 101 (FIG. 2), the detailed description thereof will not be repeated.

At the connection node between switch S2 and switch S3, capacitor 210 is disposed to hold the on-voltage (ground voltage AGND) of PMOS transistors MP1, MP2 by turning on switch S3.

Accordingly, in the configuration example of FIG. 6 (FIG. 2) in which switch S2 is connected between the gates of PMOS transistors MP1, MP2 and node N2 while switch S3 is connected between node N2 and ground node Ng, capacitor 210 is connected between node N2 and ground node Ng.

When capacitor 210 is provided, the gate voltages of PMOS transistors MP1, MP2 are certainly turned on during the transition from the power-off state to the power-on state, namely, at the timing when switch S2 is turned from off to on, so that the drain currents of PMOS transistors MP1, MP2 can be more certainly generated. As a result, because the bias circuit can be more certainly started, the starting performance can be further improved as compared with the first embodiment.

Figure 7:
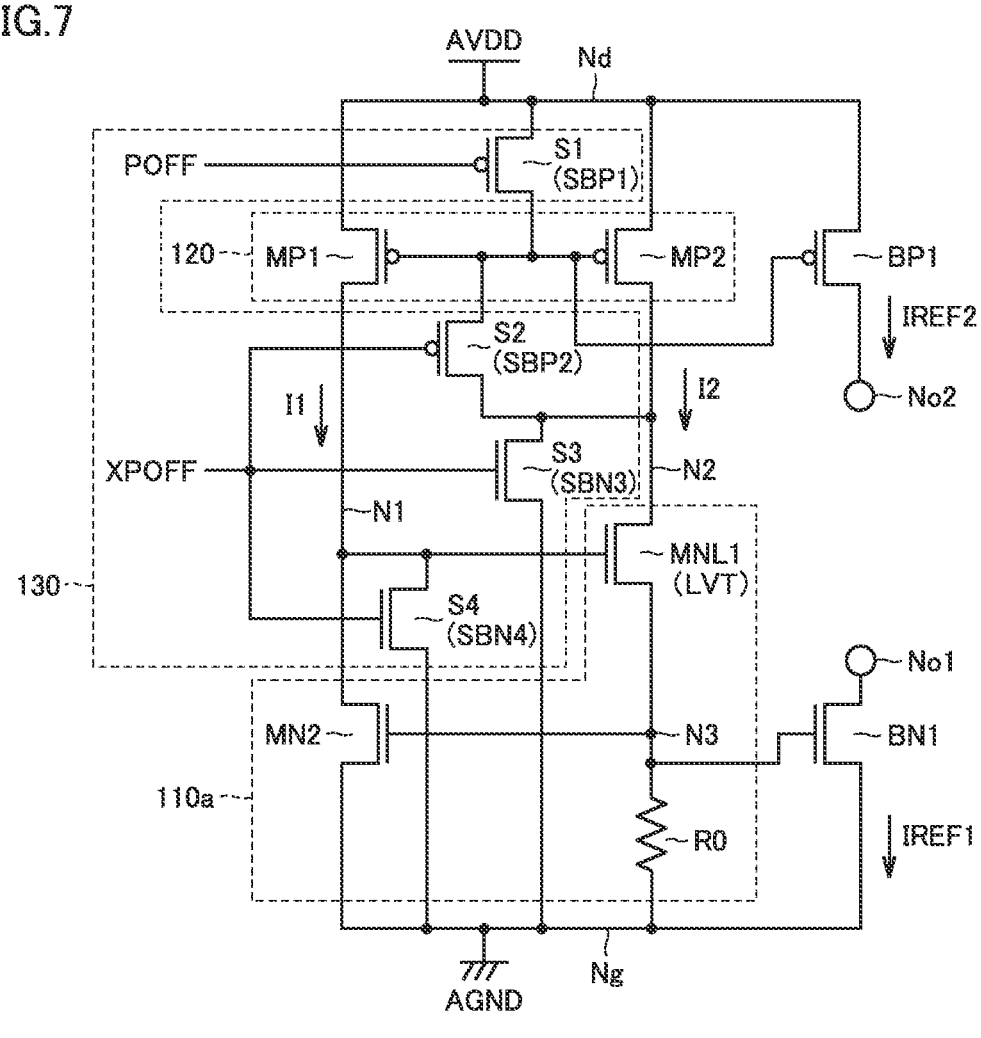
FIG. 7 is a circuit diagram illustrating a configuration of a bias circuit according to a second modification of the first embodiment.
Figure 7:
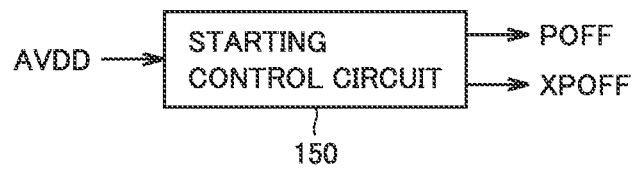

FIG. 7 is a circuit diagram illustrating a configuration of a bias circuit 103 according to a second modification of the first embodiment.

With reference to FIG. 7, bias circuit 103 of the second modification of the first embodiment is different from bias circuit 101 of the first embodiment in that NMOS transistor MN1 in current generation circuit 110a is replaced with an NMOS transistor MNL1. Because other configurations of bias circuit 103 are similar to those of bias circuit 101 (FIG. 2), the detailed description thereof will not be repeated.

NMOS transistor MNL1 has a threshold voltage lower than that of NMOS transistor MN1. For example, while other transistors are configured with an enhancement type transistor, NMOS transistor MNL1 is configured using what is called a low VT transistor (for example, the absolute value of the threshold voltage is about 0.2 (V)) having a lower absolute value of the threshold voltage than that of the enhancement type transistor. As is well known, the low VT transistor is manufactured such that the absolute value of the threshold voltage is smaller than that of the enhancement type transistor by reducing impurity concentration of a P-well or an N-well or thinning the gate oxide film as compared with the enhancement type transistor. Hereinafter, a transistor having a threshold voltage (absolute value) smaller than that of a normal enhancement type transistor is also simply referred to as "LVT".

As described in the comparative example of FIG. 1, the point of getting out of the zero bias state is to increase the voltage at node N3. When the NMOS transistor that is forcibly turned off in the power-off state by the disposition of switch S4 is configured with the LVT, at the time of the transition to the power-on state, NMOS transistor MNL1 quickly generates the drain current in accordance with the generation of the drain currents of PMOS transistors MP1, MP2, so that the voltage at node N3 can be more certainly raised, and the zero bias state can be quickly removed.

When NMOS transistor MNL1 is provided, even when other NMOS transistors MN2, BN1 are configured using the normal enhancement type transistor, the effect of quickly removing the zero bias state does not change. Consequently, the LVT can also be defined as a transistor having a smaller absolute value of the threshold voltage than that of NMOS transistors MN2, BN1.

Thus, in bias circuit 103 of the second modification of the first embodiment, the starting performance can be further improved by the disposition of the LVT. In current generation circuit 110a of bias circuit 103, NMOS transistor MNL1 corresponds to an example of the "third transistor", and NMOS transistor MN2 corresponds to an example of the "fourth transistor".

Figure 8:
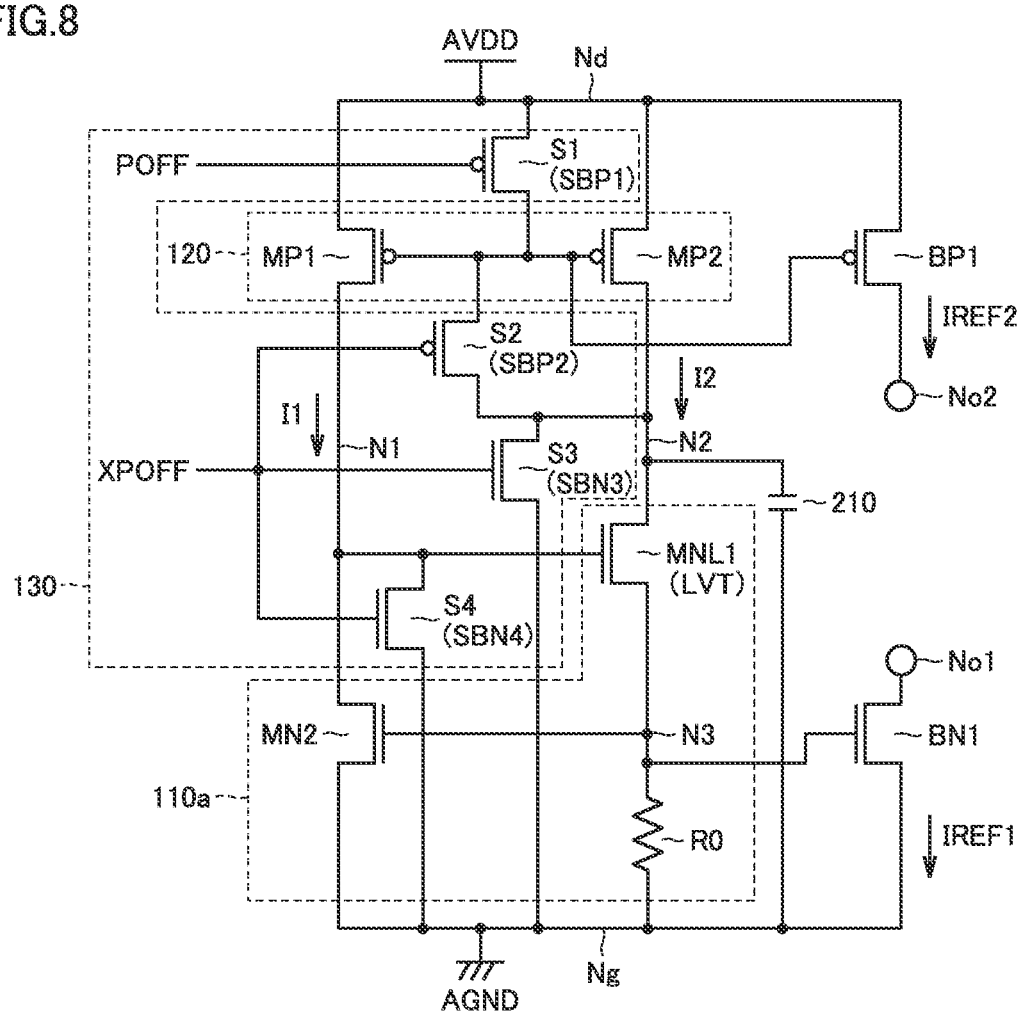
FIG. 8 is a circuit diagram illustrating a configuration of a bias circuit according to a third modification of the first embodiment.
Figure 8:
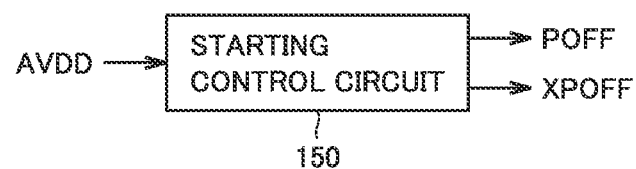

FIG. 8 is a circuit diagram illustrating a configuration of a bias circuit 104 according to a third modification of the first embodiment.

With reference to FIG. 8, bias circuit 104 of the third modification of the first embodiment further includes capacitor 210 similar to that in FIG. 6 in addition to the configuration of bias circuit 103 in FIG. 7. Because other configurations of bias circuit 104 are similar to those of bias circuit 103, the detailed description thereof will not be repeated.

According to bias circuit 104 of the third modification of the first embodiment, the starting performance can be further improved by the combination of the certain generation of the drain currents of PMOS transistors MP1, MP2 due to the disposition of capacitor 210 and the certain rise of the voltage at node N3 due to the disposition of NMOS transistor MNL1 (LVT).

Second Embodiment

In a second embodiment, a modification of the circuit configuration of the bias circuit, specifically, a modification of the current generation circuit will be described. As described below, even when the configuration of the bias circuit except the starting circuit is different, starting circuit 130 described in the first and second embodiments can be commonly applied.

Figure 9:
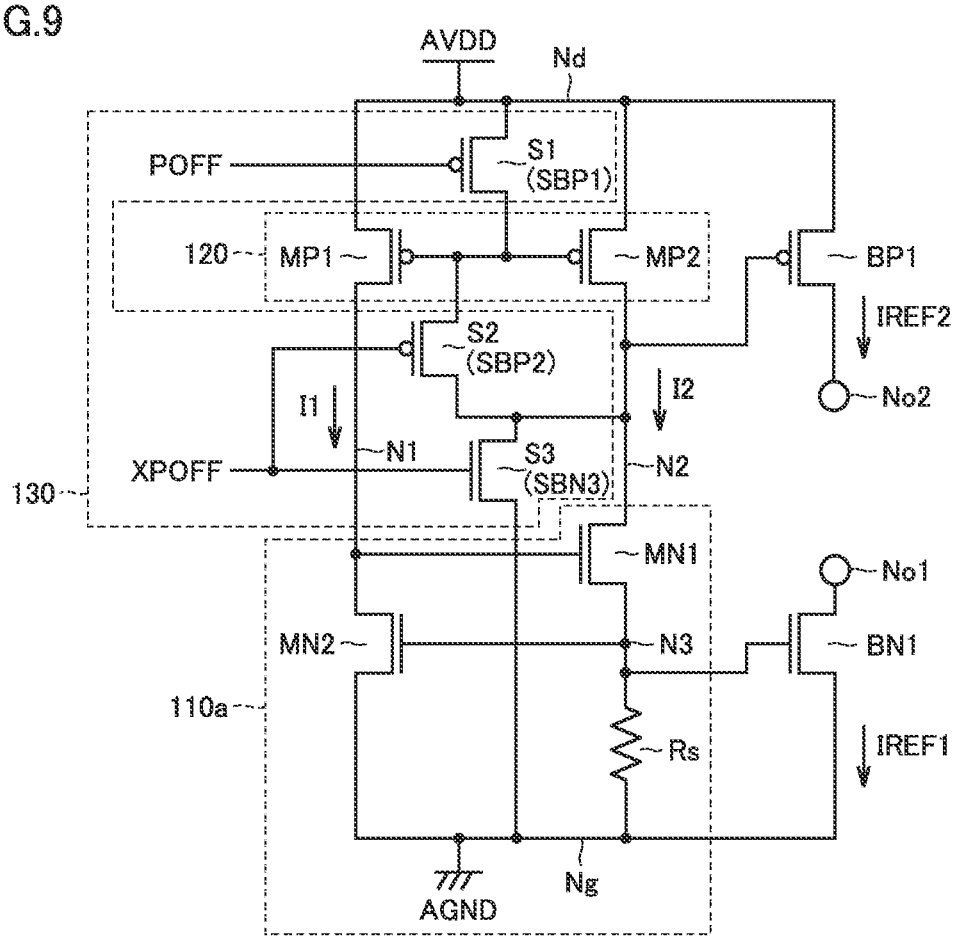
FIG. 9 is a circuit diagram illustrating a configuration of a bias circuit according to a first example of a second embodiment.
Figure 9:
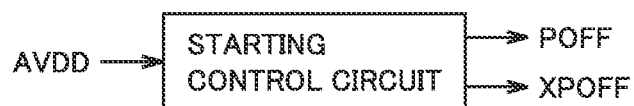

FIG. 9 is a circuit diagram illustrating a configuration of a bias circuit 101a according to a first example of the second embodiment.

With reference to FIG. 9, bias circuit 101a of the first example of the second embodiment is different from bias circuit 101 of the first embodiment in the connection destination of the gate of output transistor BP1. Specifically, the gate of output transistor BP1 is directly connected to node N2. Because other configurations of bias circuit 101a are similar to those of bias circuit 101 of the first embodiment, the detailed description thereof will not be repeated. Accordingly, current I2 and reference currents IREF1, IREF2 are similar to those of the first embodiment (bias circuit 101).

Also in bias circuit 101a, starting circuit 130 including switches S1 to S3 (or S1 to S4) can be disposed. By starting circuit 130, in the power-off state, PMOS transistors MP1, MP2 are completely turned off by turning on switch S1, and the on-voltage of PMOS transistors MP1, MP2 can be held at the connection node (node N2) of switches S2 and S3 by turning off switch S2 and turning on switch S3 using the parasitic capacitance. When the transition is made from the power-off state to the power-on state, the drain current can be certainly generated in PMOS transistors MP1, MP2 and NMOS transistors MN1, MN2 of current generation circuit 110a by turning off switches S1, S3 and turning on switch S2.

Consequently, similarly to bias circuit 101 of the first embodiment, bias circuit 101a can also enjoy the same effects as those of the first embodiment by controlling the gate voltage of PMOS transistors MP1, MP2 during the power-off state and during the transition to the power-on state.

Furthermore, also in a bias circuit 101b, switch S4 in FIG. 2 can be provided between the gates (that is, node N1) of NMOS transistors MN1, MN2 and the ground node.

Figure 10:
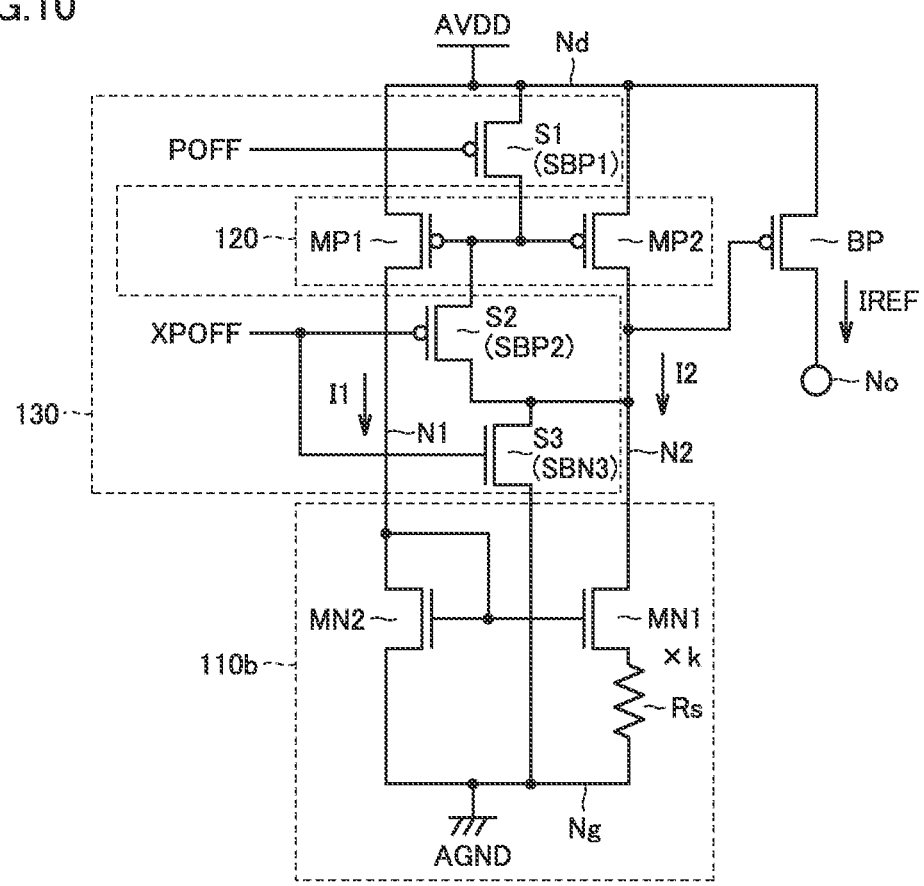
FIG. 10 is a circuit diagram illustrating a configuration of a bias circuit according to a second example of the second embodiment.
Figure 10:
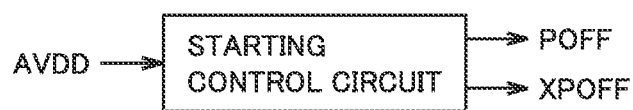

FIG. 10 is a circuit diagram illustrating a configuration of bias circuit 101b according to a second example of the second embodiment.

With reference to FIG. 10, bias circuit 101b is different from bias circuit 101a in FIG. 9 in that current generation circuit 110b is provided instead of current generation circuit 110a.

Similarly to current generation circuit 110a, current generation circuit 110b is connected between nodes N1 and N2 and ground node Ng. Current generation circuit 110b includes NMOS transistors MN1, MN2 and a resistance element Rs. The electric resistance value of resistance element Rs is also referred to as Rs. An output transistor (PMOS) BP including a gate connected to node N2 is disposed in bias circuit 101b. Output transistor BP connected between power supply node Nd and bias output node No can output reference current IREF as a bias current.

NMOS transistor MN1 is connected in series with resistance element Rs between node N2 and ground node Ng. NMOS transistor MN2 is connected between node N1 and ground node Ng. The gates of NMOS transistors MN1 and MN2 are both connected to node N1. Furthermore, a transistor size (current driving force) of NMOS transistor MN1 is designed to be k times (a real number of k≥1) the transistor of NMOS transistor MN2.

According to current generation circuit 110b, it is known that, when each transistor operates in the strong inversion region, reference current IREF is represented by the following equation (5) using a gain coefficient (β, electric resistance value Rs, and transistor size ratio k.

$$IREF=(2/\beta) \cdot (1/Rs^2) \cdot (1-1/\sqrt{k}) \quad (5)$$

Gain coefficient β is an element constant determined by surface average mobility μ, a channel length L, a channel width W, and gate capacitance Cox per unit area of NMOS transistor MN1 as represented by the following equation (6).

$$\beta=(W/L) \cdot \mu \cdot Cox \quad (6)$$

In addition, it is known that, in current generation circuit 110b, when all the transistors are operated in the weak inversion region, reference current IREF is represented by the following equation (7) using electric resistance value Rs and transistor size ratio k.

$$IREF=\eta \cdot VT \cdot \ln(k)/Rs \quad (7)$$

In the equation (7), VT is a thermal voltage, and η is a subthreshold constant determined from a process value. In particular, it is known that the thermal voltage is represented by a thermal voltage VT=k·T/q at an absolute temperature T (k: Boltzmann coefficient, q: charge amount of electrons).

In current generation circuit 110b, node N1 connected to the gates of NMOS transistors MN1, NM2 is connected to power supply node Nd and ground node Ng through the transistor. Therefore, the starting circuit is required to be disposed for current generation circuit 110b.

Starting circuit 130 including switches S1 to S3 can also be applied to bias circuit 101b in which current generation circuit 110b and current mirror circuit 120 are connected to power supply node Nd and ground node Ng through nodes N1 and N2.

Also in bias circuit 101b, starting circuit 130 can control the gate voltages of PMOS transistors MP1, MP2 during the power-off state and during the transition to the power-on state. Thus, drain currents can be certainly generated in PMOS transistors MP1, MP2 and NMOS transistors MN1, MN2 of current generation circuit 110b.

Consequently, bias circuit 101b can also enjoy the same effects as those of bias circuit 101 of the first embodiment. Furthermore, also in bias circuit 101b, switch S4 in FIG. 2 can be provided between the gates (that is, node N1) of NMOS transistors MN1, MN2 and the ground node.

Figure 11:
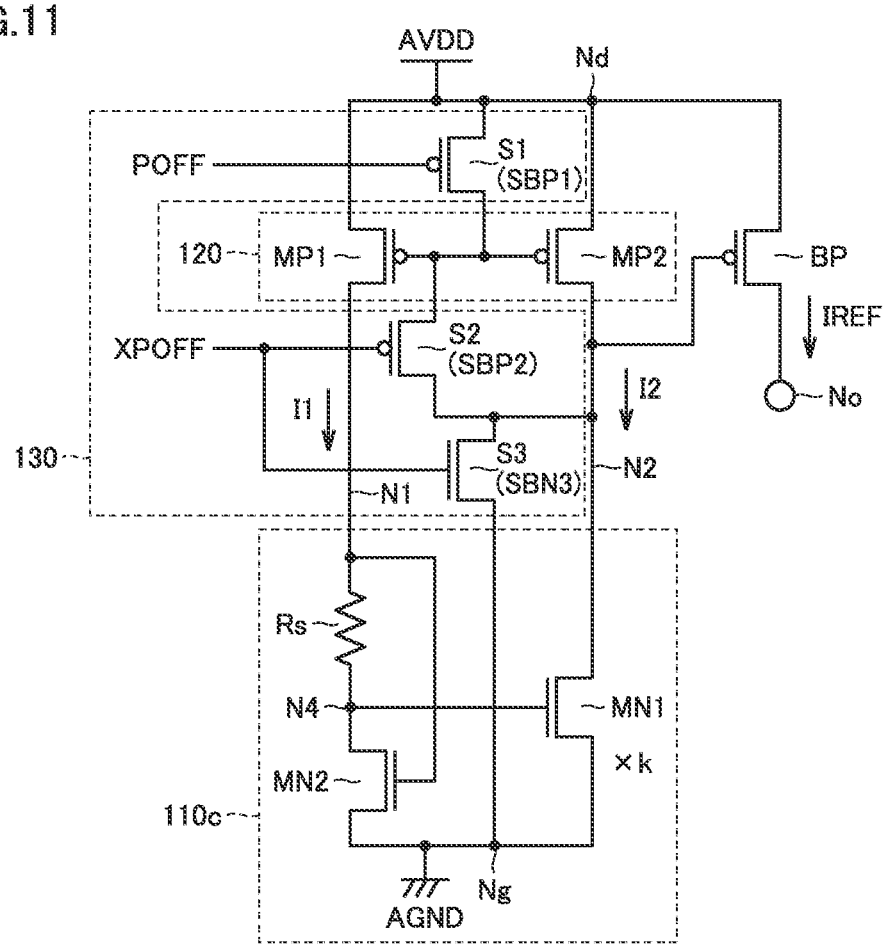
FIG. 11 is a circuit diagram illustrating a configuration of a bias circuit according to a third example of the second embodiment.

FIG. 11 is a circuit diagram illustrating a configuration of a bias circuit 101c according to a third example of the second embodiment.

With reference to FIG. 11, bias circuit 101c is different from bias circuit 101b in FIG. 10 in that current generation circuit 110c is provided instead of current generation circuit 110b.

Current generation circuit 110c is connected between nodes N1 and N2 and ground node Ng similarly to current generation circuits 110a, 110b. Current generation circuit 110c includes NMOS transistors MN1, MN2 and resistance element Rs (electric resistance value Rs).

NMOS transistor MN1 is connected between node N2 and ground node Ng. Resistance element Rs is connected between node N1 and node N4. NMOS transistor MN2 is connected between node N4 and ground node Ng. The gate of NMOS transistor MN1 is connected to node N4, and the gate of NMOS transistor NM2 is connected to node N1. Similarly to FIG. 10, the transistor size (current driving force) of NMOS transistor MN1 is k times the transistor size of NMOS transistor MN2.

Also in bias circuit 101c, reference current IREF output by output transistor (PMOS) BP is expressed by the equation (5) or the equation (7) similarly to bias circuit 101b. In bias circuit 101c, the bias current can be generated even when each transistor operates in either the strong inversion region or the weak inversion region. In addition, because the substrate bias effect is not generated in bias circuit 101c, the bias current can be made more accurately compared with bias circuit 101b.

Starting circuit 130 including switches S1 to S3 can also be applied to bias circuit 101c in which current generation circuit 110c and current mirror circuit 120 are connected to power supply node Nd and ground node Ng through nodes N1 and N2.

Also in bias circuit 101c, starting circuit 130 controls the gate voltages of PMOS transistors MP1, MP2 during the power-off state and during the transition to the power-on state, the same effects as those of bias circuit 101 of the first embodiment can be obtained. Furthermore, also in bias circuit 101c, switch S4 in FIG. 2 can be provided between the gates (that is, node N1) of NMOS transistors MN1, MN2 and the ground node.

Figure 12:
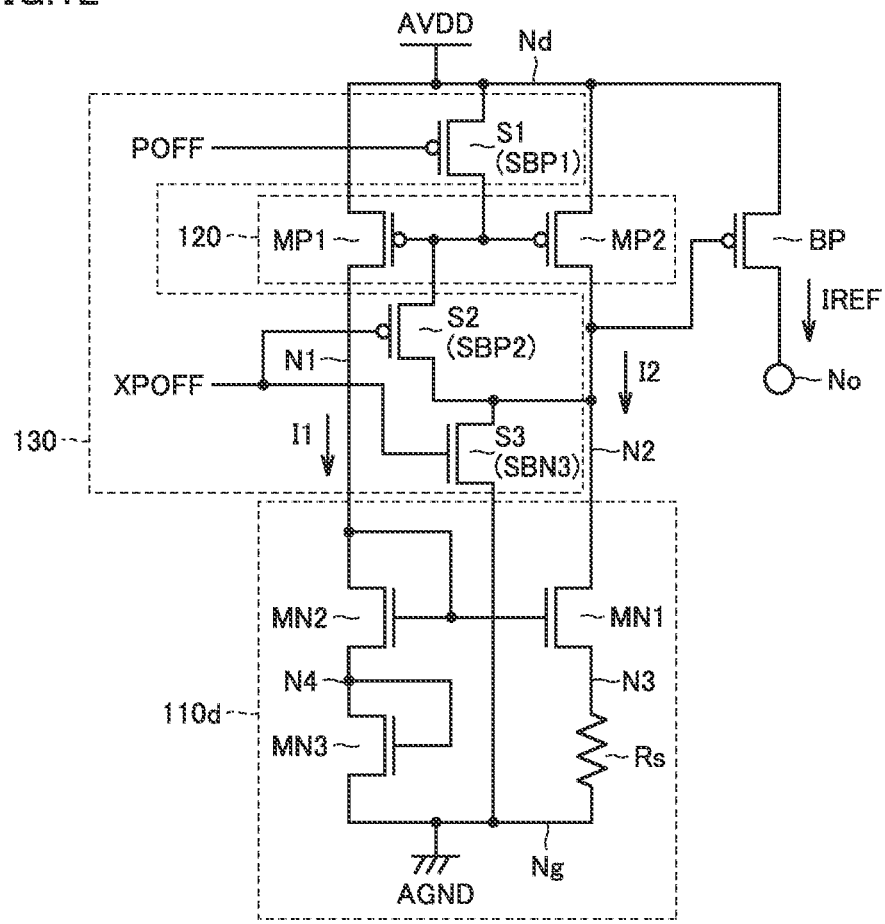
FIG. 12 is a circuit diagram illustrating a configuration of a bias circuit according to a fourth example of the second embodiment.
Figure 12:
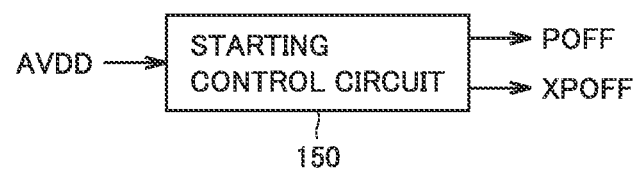

FIG. 12 is a circuit diagram illustrating a configuration of a bias circuit 101d according to a fourth example of the second embodiment.

With reference to FIG. 12, bias circuit 101d is different from bias circuit 101b in FIG. 10 in that a current generation circuit 110d is provided instead of the current generation circuit 110b.

Current generation circuit 110d is connected between nodes N1 and N2 and ground node Ng similarly to current generation circuits 110a to 110c. Current generation circuit 110d includes NMOS transistors MN1 to MN3 and resistance element Rs (electric resistance value Rs).

NMOS transistor MN1 is connected between node N2 and node N3, and resistance element Rs is connected between node N3 and ground node Ng. NMOS transistor MN2 is connected between node N1 and node N4, and NMOS transistor MN3 is connected between node N4 and ground node Ng. The gates of NMOS transistors MN1 and NM2 are connected to node N1. The gate of NMOS transistor MN3 is connected to node N4.

The basic operation of current generation circuit 110d is similar to that of current generation circuit 110a. That is, current I2 is represented as I2=Vt/Rs using electric resistance value Rs of the resistance element and threshold voltage Vt of NMOS transistor MN3. In addition, reference currents IREF1, IREF2 also have current values proportional to current I2.

In current generation circuit 110d, because NMOS transistors MN2, MN3 connected between node N1 and ground node Ng are diode-connected, an amplification stage is only NMOS transistor MN1. For this reason, bias circuit 101d can operate more stably than bias circuit 101, 101a, and phase compensation becomes unnecessary.

Starting circuit 130 including switches S1 to S3 can also be applied to bias circuit 101d in which current generation circuit 110d and current mirror circuit 120 are connected to power supply node Nd and ground node Ng through nodes N1 and N2.

Also in bias circuit 101d, starting circuit 130 controls the gate voltages of PMOS transistors MP1, MP2 during the power-off state and during the transition to the power-on state, the same effects as those of bias circuit 101 of the first embodiment can be obtained. Furthermore, also in bias circuit 101b, switch S4 in FIG. 2 can be provided between the gates (that is, node N1) of NMOS transistors MN1, MN2 and the ground node.

Figure 13:
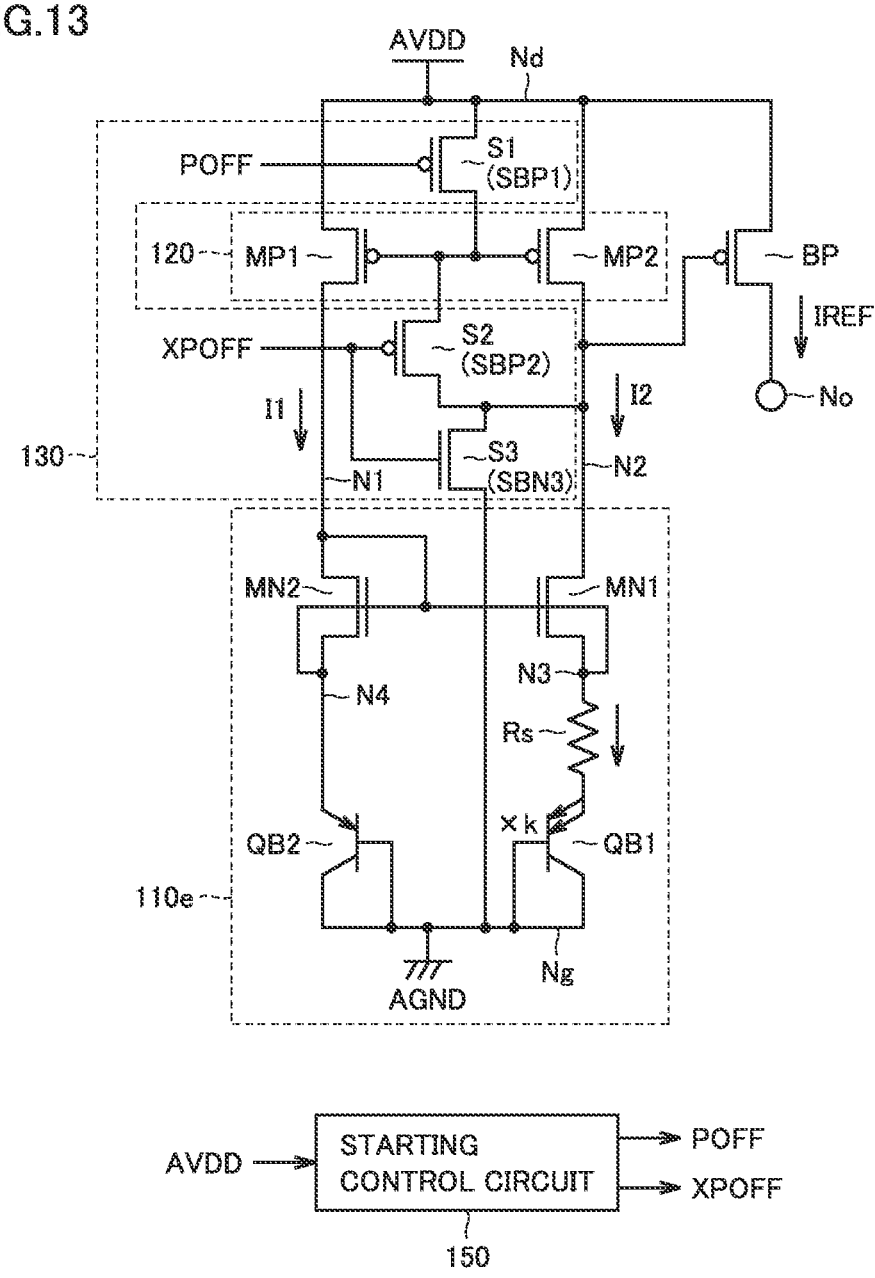
FIG. 13 is a circuit diagram illustrating a configuration of a bias circuit according to a fifth example of the second embodiment.

FIG. 13 is a circuit diagram illustrating a configuration of a bias circuit 101e according to a fifth example of the second embodiment.

With reference to FIG. 13, bias circuit 101e is different from bias circuit 101b in FIG. 10 in that a current generation circuit 110e is provided instead of current generation circuit 110b.

Current generation circuit 110e is connected between nodes N1 and N2 and ground node Ng similarly to current generation circuits 110a to 110d. Current generation circuit 110e includes NMOS transistors MN1, MN2, bipolar transistors (PNP transistors) QB1, QB2, and resistance element Rs (electric resistance value Rs).

NMOS transistor MN1 is connected between node N2 and node N3, and NMOS transistor MN2 is connected between node N1 and node N4. The gates of NMOS transistors MN1 and MN2 are connected to node N1. A back gate (body) of NMOS transistor MN1 is connected to node N3, and a back gate (body) of NMOS transistor MN2 is connected to node N4.

Resistance element Rs and PNP transistor QB1 are connected in series between node N3 and ground node Ng. PNP transistor QB2 is connected between node N4 and ground node Ng. The bases of PNP transistors QB1 and QB2 are connected to ground node Ng. The transistor size of PNP transistor QB1 is k times (a real number of k≥1) the transistor of PNP transistor QB2.

The basic operation of current generation circuit 110e is similar to that of current generation circuit 110a. Specifically, current I2 is represented in the same manner as in the above-described equation (7) using electric resistance value Rs of the resistance element and above-described transistor size ratio k (I2=η·VT·ln(k)/Rs). In addition, reference currents IREF1, IREF2 also have current values proportional to current I2. In current generation circuit 110e, because there is no amplification action, the circuit operation is further stabilized. For this reason, similarly to bias circuit 101d (FIG. 12), bias circuit 101e does not need the phase compensation.

Starting circuit 130 including switches S1 to S3 can also be applied to bias circuit 101e in which current generation circuit 110e and current mirror circuit 120 are connected to power supply node Nd and ground node Ng through nodes N1 and N2.

Also in bias circuit 101e, starting circuit 130 controls the gate voltages of PMOS transistors MP1, MP2 during the power-off state and during the transition to the power-on state, the same effects as those of bias circuit 101 of the first embodiment can be obtained. Furthermore, also in bias circuit 101e, switch S4 in FIG. 2 can be provided between the gates (that is, node N1) of NMOS transistors MN1, MN2 and the ground node.

As described in the second embodiment, even when the configuration of current generation circuit 110 (current generation circuits 110a to 110e are collectively referred to a current generation circuit 110) is changed, in the configuration in which current generation circuit 110 and current mirror circuit 120 are connected in series between power supply node Nd and ground node Ng through nodes N1 and N2, starting circuit 130 described in the first embodiment can be commonly applied to ensure the good starting performance.

Also in each of bias circuits 101a to 101e, similarly to FIG. 6, a capacitor 210 can be further disposed between connection node (node N2) of switches S2 and S3 and ground node Ng. Alternatively, similarly to FIG. 7, NMOS transistor MN1 of current generation circuit 110b can also be configured with the LVT.

Third Embodiment

In a second embodiment, the bias circuit having a configuration in which current mirror circuit 120 includes the P-type field effect transistor (PMOS transistor) and current generation circuit 110 includes the N-type field effect transistor (NMOS transistor) has been described. That is, the configuration example in which the P-type corresponds to the "first conductivity type" and the N-type corresponds to the "second conductivity type" has been described.

On the other hand, in the bias circuit of the third embodiment, the conductivity type of the transistor can also be changed from the configurations of the first and second embodiments. In the third embodiment, such a modification will be described.

Figure 14:
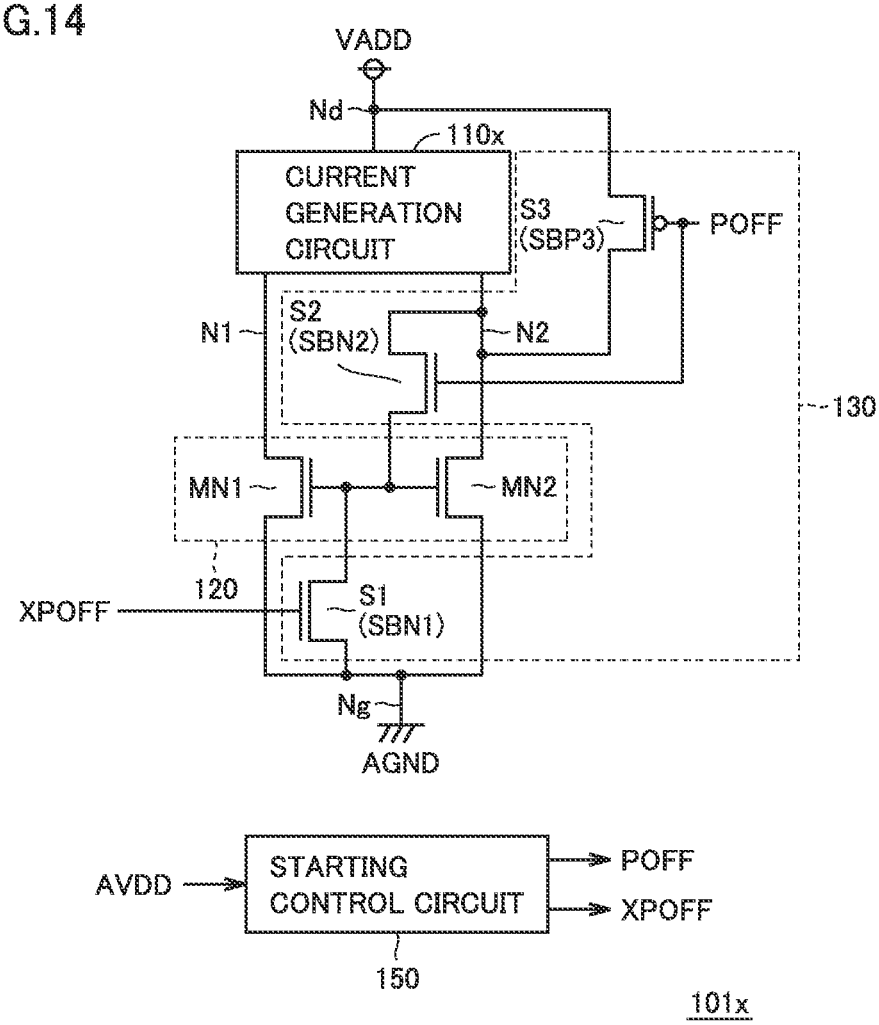
FIG. 14 is a circuit diagram illustrating a configuration of a bias circuit according to a third embodiment.

FIG. 14 is a circuit diagram illustrating a configuration of the bias circuit of the third embodiment.

With reference to FIG. 14, bias circuit 101x of the third embodiment includes a current generation circuit 110x, current mirror circuit 120, starting circuit 130, and starting control circuit 150.

Also in bias circuit 101x, current generation circuit 110 and current mirror circuit 120 are connected in series between power supply node Nd and ground node Ng through nodes N1 and N2. Starting control circuit 150 is configured similarly to the first embodiment, and generates starting control signals POFF, XPOFF. That is, similarly to the first and second embodiments, in the power-off state, starting control signal POFF is set to the L level while the starting control signal XPOFF is set to the H level. On the other hand, in the power-on state, starting control signal POFF is set to the H level, while starting control signal XPOFF is set to the L level.

In bias circuit 101x, current mirror circuit 120 includes NMOS transistors MN1 and MN2, and is connected between ground node Ng and nodes N1, N2. The gates of NMOS transistors MN1 and NM2 are connected to each other.

Current generation circuit 110x can be configured by replacing the NMOS transistor with the PMOS transistor in current generation circuits 110a to 110e described in the first and second embodiments, and further by modifying the connection destination such that nodes N1, N2 are connected to power supply node Nd and ground node Ng is connected to node N1 or N2.

In the third embodiment, contrary to the first and second embodiments, the off-voltage of the transistor (NMOS transistor MN1, MN2) constituting current mirror circuit 120 is ground voltage AGND, and the on-voltage is power supply voltage AVDD. Consequently, in the third embodiment, ground node Ng corresponds to an example of a "first voltage node" that supplies the off-voltage of current mirror circuit 120, and power supply node Nd corresponds to an example of a "second voltage node" that supplies the on-voltage of current mirror circuit 120.

Starting circuit 130 includes at least switches S1 to S3. Switch S1 is connected between the gates of NMOS transistors MN1, MN2 constituting current mirror circuit 120 and ground node Ng (that is, the node that supplies the off-voltage). Switch S1 includes an NMOS transistor SBN1 having the gate to receive starting control signal XPOFF. Thus, switch S1 (NMOS transistor SBN1) is turned on in the power-off state and is turned off in the power-on state similarly to the first and second embodiments.

Switch S2 is connected between the gates of NMOS transistors MN1, MN2 and node N2. Switch S2 includes an NMOS transistor SBN2 having the gate to receive starting control signal POFF. Thus, switch S2 (NMOS transistor SBN2) is turned off in the power-off state and is turned on in the power-on state similarly to the first and second embodiments.

Switch S3 is connected between node N2 and power supply node Nd (that is, the node that supplies the on-voltage). Switch S2 includes a PMOS transistor SBP3 having the gate to receive starting control signal POFF. Thus, switch S3 (PMOS transistor SBP3) is turned on in the power-off state and is turned off in the power-on state similarly to the first and second embodiments.

Consequently, also in bias circuit 101x, in the power-off state (POFF=L, XPOFF=H) before the power is turned on, NMOS transistors MN1, MN2 are certainly turned off by turning on switch S1 and turning off switch S2. Furthermore, in node N2 disconnected from NMOS transistors MN1, MN2 by turning off switch S2, power supply voltage AVDD (on-voltage) is held by turning on switch S3.

In the power-on state (POFF=H, XPOFF=L) in which power supply voltage AVDD increases after the power is turned on, the gates of NMOS transistors MN1, MN2 are disconnected from ground voltage AGND (off-voltage) by turning off switch S1, and are supplied with the on-voltage (ground voltage AGND) by connection with node N2 by turning on switch S2.

Thus, also in bias circuit 101x, the drain current can be certainly generated in NMOS transistors MN1, MN2 constituting current mirror circuit 120 during the transition from the power-off state to the power-on state. That is, similarly to the first and second embodiments, when the gate voltage of the transistor (NMOS transistor MN1, MN2) constituting current mirror circuit 120 is controlled during the power-off state and during the transition to the power-on state, bias circuit 101x can be stably activated, and the power consumption after the starting can be reduced and the accuracy of the bias can be increased.

Also in bias circuit 101x, the gates of NMOS transistors MN1, MN2 are directly connected to node N2, and switches S2 and S3 can be connected in series through a separate, independent node different from node N2. Alternatively, capacitor 210 similar to that in FIG. 6 can be further disposed between the connection node (node N2) of switches S2 and S3 and ground node Ng.

In current generation circuit 110x including the PMOS transistor, the PMOS transistor disposed instead of NMOS transistor MN1 in current generation circuits 110a to 110e can be configured with the LVT.

As described above, in the third embodiment, it is understood that the N-type corresponds to an example of the "first conductivity type" and the P-type corresponds to an example of the "second conductivity type". Similarly, ground node Ng connected to current mirror circuit 120 corresponds to an example of the "first power supply node", and power supply node Nd connected to current generation circuit 110 corresponds to the "second power supply node". As a result, contrary to the first and second embodiments, ground voltage AGND corresponds to the "first voltage", and power supply voltage AVDD corresponds to the "second voltage".

Furthermore, in the first to third embodiments, the P-type field effect transistor (PMOS transistor) can be replaced with the PNP-type bipolar transistor and the N-type field effect transistor (NMOS transistor) can be replaced with the NPN-type bipolar transistor. That is, the "first and second transistors" in the present disclosure include both the field effect transistor and the bipolar transistor, and the "first and second conductivity types" include not only the P-type and the N-type but also the PNP-type and the NPN-type. Also in this case, starting circuit 130 including at least switches S1 to S3 is caused to act on the base (control electrode) of the bipolar transistor constituting current mirror circuit 120, so that the bias circuit having the same effect can be implemented.

Fourth Embodiment

In a fourth embodiment, a configuration example of a device including the bias circuit described in the first to third embodiment as one element will be described.

Figure 15:
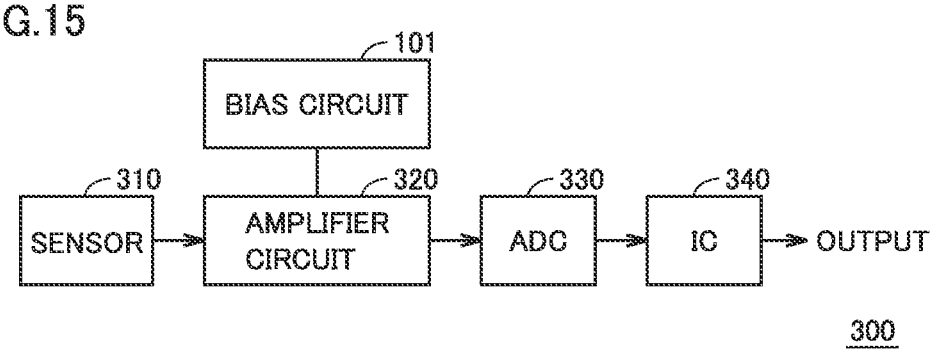
FIG. 15 is a block diagram illustrating a configuration example of a sensor device according to a first example of a fourth embodiment.

FIG. 15 is a block diagram illustrating a configuration example of a sensor device according to a first example of the fourth embodiment.

With reference to FIG. 15, a sensor device 300 of the fourth embodiment includes bias circuit 101, a sensor 310, an amplifier circuit 320, an analog to digital converter (ADC) 330, and an integrated circuit (IC) 340. Bias circuit 101 is a general term for bias circuits 101 to 104, 101a to 101e, 101x described in the first to third embodiments. As described above, bias circuit 101 outputs at least the highly accurate bias current.

For example, sensor 310 includes an infrared sensor for human detection. Sensor 310 outputs an analog voltage corresponding to the physical quantity of the measurement target. Amplifier circuit 320 outputs an analog voltage obtained by amplifying the output voltage of sensor 310 using the bias current from bias circuit 101.

ADC 330 converts the analog voltage output from amplifier circuit 320 into digital data of a plurality of bits. Thus, the digital data indicating the output voltage at sensor 310 is obtained. The digital data from ADC 330 is input to IC 340. IC 340 generates an output signal indicating the output voltage of sensor 310 by performing signal processing on the digital data. For example, IC 340 can execute noise removal processing or the like by applying a low-pass filter.

Power supply voltage AVDD and ground voltage AGND are supplied to each element in FIG. 15 through power supply node Nd and ground node Ng described in the first to third embodiments. When an instruction to stop the supply of power supply voltage AVDD to power supply node Nd and start the supply of power supply voltage AVDD by turning on the power supply is given from the outside of sensor device 300, sensor device 300 enters either the power-off state or the power-on state.

Bias circuit 101 of the first to third embodiments does not consume the current in the power-off state, and can be certainly started to generate the bias current with high accuracy during the transition to the power-on state. Furthermore, in the power-on state, the useless current as described in the comparative example and PTL 1 is not continuously generated. As a result, the power consumption of the entire system of sensor device 300 can be reduced through the prevention of the power consumption of bias circuit 101.

The amount of heat generated by sensor device 300 can be prevented by reducing the power consumption, the heat dissipation design of the element is facilitated, and the size of the heat sink or the like can be reduced or the disposition thereof can be omitted. Thus, downsizing of sensor device 300, relaxation of design restrictions, or the like can be implemented. In addition, even in the case of being driven with limited electric power by a battery or a solar panel, the operable time can be extended.

In order to further reduce the power consumption, bias circuit 101 is suitable for the application in which the power-off state and the power-on state are frequently switched in order to intermittently operate sensor device 300. This is because starting circuit 130 can certainly generate the bias current in response to the transition from the power-off state to the power-on state.

Figure 16:
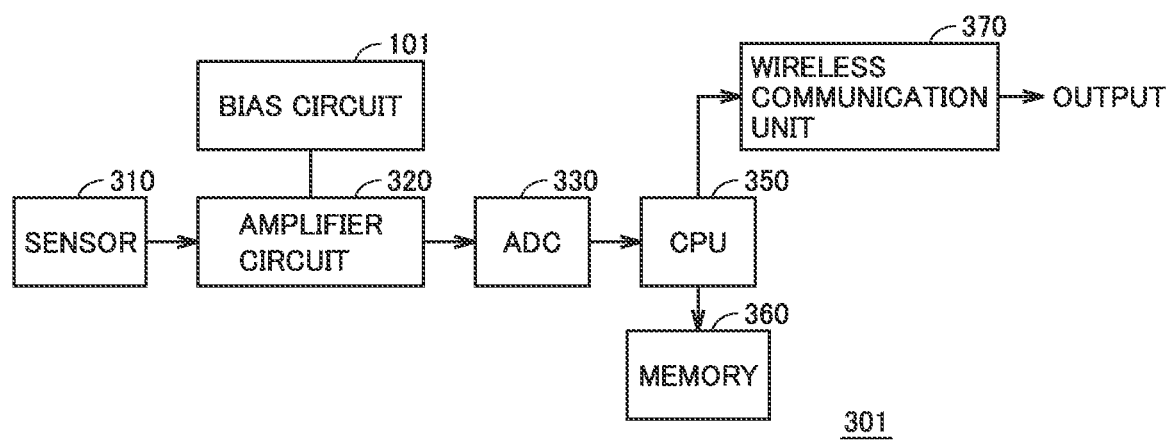
FIG. 16 is a block diagram illustrating a configuration example of a wireless sensor device according to a second example of the fourth embodiment.

FIG. 16 is a block diagram illustrating a configuration example of a wireless sensor device according to a second example of the fourth embodiment.

With reference to FIG. 16, a wireless sensor device 301 of the fourth embodiment includes bias circuit 101, sensor 310, amplifier circuit 320, ADC 330, an arithmetic unit (central processing unit (CPU)) 350, a memory 360, and a wireless communication unit (IC) 370, which are similar to those in FIG. 15.

Arithmetic unit 350 can perform arbitrary signal processing on the digital data from ADC 330 by executing the program stored in memory 360. Wireless communication unit 370 is configured by including an interface transmitting or transmitting and receiving the signal according to a predetermined wireless communication protocol, and can transmit and receive the signal to and from wireless sensor device 301. Thus, data and information obtained by signal processing in arithmetic unit 350, namely, a transmission signal based on the digital data can be transmitted to the outside of wireless sensor device 301 according to a predetermined wireless communication protocol.

Power supply voltage AVDD and ground voltage AGND are also supplied to each element in FIG. 16 through power supply node Nd and ground node Ng described in the first to third embodiments. As described above, wireless sensor device 301 enters either the power-off state or the power-on state in response to the stop of the supply of power supply voltage AVDD and the start of the supply of power supply voltage AVDD by turning on the power supply.

Also in wireless sensor device 301 of FIG. 16, the same effects as those described in sensor device 300 described above can be enjoyed due to the good starting performance of bias circuit 101 and the high bias accuracy and low power consumption after the starting.

In wireless sensor device 301, wireless communication unit 370 can receive a command or information from the outside of wireless sensor device 301. Then, arithmetic unit 350 can control the operation of wireless sensor device 301 based on the received command and information. For example, the power-on state and the power-off state can also be switched by controlling the supply stop and the supply start of power supply voltage AVDD to power supply node Nd inside wireless sensor device 301 based on these pieces of information or commands. Also in this case, bias circuit 101 can be certainly started in response to the transition from the power-off state to the power-on state.

Furthermore, in addition to the above-described example, bias circuit 101 of the fourth embodiment can be applied to an analog circuit or an analog-digital mixed large scale integrated circuit (LSI).

It should be considered that the disclosed embodiments are an example in all respects and not restrictive. The scope of the present disclosure is defined by not the description above, but the claims, and it is intended that all modifications within the meaning and scope of the claims and their equivalents are included in the present invention.

REFERENCE SIGNS LIST 100 to 104, 101a to 101e, 101x: bias circuit, 110a to 110e, 110x: current generation circuit, 120: current mirror circuit, 130, 200: starting circuit, 150, 150x, 150y: starting control circuit, 160: comparator, 162, 164, 170, 172, 174: inverter, 210: capacitor, 300: sensor device, 301: wireless sensor device, 310: sensor, 320: amplifier circuit, 350: arithmetic unit, 360: memory, 370: wireless communication unit, AVDD: power supply voltage, AGND: ground voltage, IREF, IREF1, IREF2: reference current (bias current), N0 to N4, Na, Nb, Ns, Nx, Ny: node, Nd: power supply node, Ng: ground node, No, No1, No2: bias output node, POFF, XPOFF: starting control signal, S1 to S4: switch

The invention claimed is:
1. A bias circuit comprising:
a current mirror circuit to include first conductivity type first and second transistors connected between a first power supply node that supplies a first voltage and first and second nodes;
a current generation circuit to include a second conductivity type transistor connected between a second power supply node that supplies a second voltage and the first and second nodes; and a starting control circuit to detect, during the starting of the bias circuit, a transition from a first state continuing from before starting to a second state accompanied by the starting, wherein control electrodes of the first and second transistors connected to each other are electrically connected to one node that is one of the first and second nodes at least in the second state, the bias circuit further comprises a starting circuit to switch a connection destination of the control electrodes between the first state and the second state during the starting of the bias circuit, the starting circuit includes a first switch connected between a first voltage node that supplies an off-voltage to turn off the first and second transistors and the control electrodes, a second switch connected between a third node and the control electrodes, and a third switch connected between a second voltage node that supplies an on-voltage to turn on the first and second transistors and the third node, the second switch is turned off in the first state and turned on in the second state, and the first switch and the third switch are turned on in the first state and turned off in the second state.

2. The bias circuit according to claim 1, wherein
the third node and the one node are an identical node, and
the second switch is connected between the control electrodes and the one node.

3. The bias circuit according to claim 1, wherein
the current generation circuit includes a second conductivity type third transistor connected in series with a resistance element between the one node and the second power supply node,
the starting circuit further includes a fourth switch connected between a control electrode of the third transistor and a third voltage node that supplies a voltage to turn off the third transistor, and
the fourth switch is turned on in the first state and turned off in the second state.

4. The bias circuit according to claim 3, wherein
each of the first to third transistors is a field effect transistor, and
the third transistor is configured with a transistor having an absolute value of a threshold voltage smaller than an absolute value of a threshold voltage of an enhancement type transistor.

5. The bias circuit according to claim 3, wherein
the current generation circuit further includes a second conductivity type fourth transistor electrically connected between the other node of the first and second nodes and the second power supply node,
each of the first to fourth transistors is a field effect transistor, and
the absolute value of the threshold voltage of the third transistor is smaller than an absolute value of a threshold voltage of the fourth transistor.

6. The bias circuit according to claim 1, further comprising a capacitor connected to the third node to hold the on-voltage in the first state.

7. The bias circuit according to claim 1, wherein the starting circuit detects transition from the first state in which a power supply voltage is lower than a predetermined reference voltage to the second state in which the power supply voltage is higher than the reference voltage according to an increase in the power supply voltage that is a higher voltage of the first and second voltages when the bias circuit is powered on.

8. The bias circuit according to claim 1, wherein
the first voltage is higher than the second voltage,
the first conductivity type is a P-type while the second conductivity type is an N-type,
the first voltage node is the first power supply node, and
the second voltage node is the second power supply node.

9. The bias circuit according to claim 1, wherein
the first voltage is lower than the second voltage,
the first conductivity type is an N-type while the second conductivity type is a P-type,
the first voltage node is the second power supply node, and
the second voltage node is the first power supply node.

10. A sensor device comprising:
a sensor to output a detection voltage corresponding to a physical quantity of a measurement target;
the bias circuit according to claim 1 to output at least a bias current; and
an amplifier circuit to generate an output voltage based on the detection voltage from the sensor by an amplification operation using the bias current from the bias circuit.

11. A wireless sensor device comprising:
a sensor to output a detection voltage corresponding to a physical quantity of a measurement target;
the bias circuit according to claim 1 to output at least a bias current;
an amplifier circuit to generate an output voltage based on the detection voltage from the sensor by an amplification operation using the bias current from the bias circuit; and
a wireless communication unit to output a transmission signal, which is generated based on digital data obtained by analog-digital conversion of the output voltage of the amplifier circuit and conforms to a predetermined communication protocol, by wireless communication.

12. A bias circuit comprising:
a first transistor electrically connected between a first power supply node that supplies a first voltage and a first node;
a second transistor electrically connected between the first power supply node and a second node, the second transistor having a control electrode connected to a control electrode of the first transistor, the second transistor having the same conductivity type as a conductivity type of the first transistor;
a current generation circuit connected between a second power supply node that supplies a second voltage and the first and second nodes;
a first control switch connected between the control electrodes of the first and second transistors and one node that is one of the first and second nodes; and
a second control switch connected between the one node and a node that supplies an on-voltage to turn on the first and second transistors, wherein
the current generation circuit is configured such that a first element group electrically connected between the first node and the second power supply node is different from a second element group electrically connected between the second node and the second power supply node, and the first control switch is turned off when the second control switch is turned on, and the second control switch is turned off when the first control switch is turned on.

13. The bias circuit according to claim 12, wherein the second control switch is connected between the one node and the second power supply node.

14. The bias circuit according to claim 12, wherein
one of the first element group and the second element group is configured to include a transistor and include no resistance element, and
the other of the first element group and the second element group is configured to include a transistor and a resistance element.

15. The bias circuit according to claim 12, wherein
one of the first element group and the second element group includes a third transistor, and
the other of the first element group and the second element group includes a fourth transistor having a transistor size that is k times as large as a transistor size of the third transistor and a resistance element connected to the fourth transistor in series, k being a real number more than or equal to 1.

16. The bias circuit according to claim 12, wherein
the first voltage is higher than the second voltage, and
the first and second transistors are constituted of P-type transistors.

17. The bias circuit according to claim 12, wherein
the first voltage is lower than the second voltage, and
the first and second transistors are constituted of N-type transistors.

* * * * *